United States Patent
Healy et al.

(10) Patent No.: US 11,290,819 B2
(45) Date of Patent: Mar. 29, 2022

(54) DISTRIBUTED AMPLIFICATION AND CONTROL SYSTEM FOR IMMERSIVE AUDIO MULTI-CHANNEL AMPLIFIER

(71) Applicant: Dolby Laboratories Licensing Corporation, San Francisco, CA (US)

(72) Inventors: Andrew Healy, San Francisco, CA (US); Andrew Michael Poulain, San Jose, CA (US); Joel A. Butler, Springfield, MO (US); Dossym Nurmukhanov, Millbrae, CA (US); James Tanner Cook, Alameda, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 852 days.

(21) Appl. No.: 16/073,270

(22) PCT Filed: Jan. 27, 2017

(86) PCT No.: PCT/US2017/015481
§ 371 (c)(1),
(2) Date: Jul. 26, 2018

(87) PCT Pub. No.: WO2017/132597
PCT Pub. Date: Aug. 3, 2017

(65) Prior Publication Data
US 2021/0235192 A1  Jul. 29, 2021

Related U.S. Application Data

(60) Provisional application No. 62/289,058, filed on Jan. 29, 2016.

(30) Foreign Application Priority Data

Jan. 29, 2016  (EP) ..................................... 16153469

(51) Int. Cl.
*H04R 5/04* (2006.01)
*G10L 19/008* (2013.01)
(Continued)

(52) U.S. Cl.
CPC .............. *H04R 5/04* (2013.01); *G10L 19/008* (2013.01); *H03F 3/183* (2013.01); *H04R 1/025* (2013.01);
(Continued)

(58) Field of Classification Search
None
See application file for complete search history.

(56) References Cited

U.S. PATENT DOCUMENTS 3,683,100 A   8/1972  Deal
8,363,865 B1  1/2013  Bottum
(Continued)

FOREIGN PATENT DOCUMENTS

CN   2738518     11/2005
CN   201976225   9/2011
(Continued)

*Primary Examiner* — Qin Zhu

(57) ABSTRACT

Embodiments include a power source outputting power to drive speakers and lights in a venue; a control unit coupled to the power source and outputting multi-channel digital audio data to the speakers and light control data to the lights; and a unitary transmission bus coupling the output of the power source to the speakers and the lights and transmitting the power, the digital audio data, and the light control data to the speakers and the lights. The lighting control data comprises metadata superimposed over the digital audio data and power. Other actuators besides lights may also be used such as e.g. steam/water generators, smell/aroma generators, prop movements, LCD displays, hologram generators, and the like.

18 Claims, 11 Drawing Sheets

(51) Int. Cl.
*H03F 3/183* (2006.01)
*H04R 1/02* (2006.01)
*H04R 5/02* (2006.01)
*H04S 3/00* (2006.01)
*H04S 7/00* (2006.01)
*H05B 47/18* (2020.01)
*H05B 45/20* (2020.01)
*H03F 1/52* (2006.01)
*H03F 3/68* (2006.01)

(52) U.S. Cl.
CPC .............. *H04R 5/02* (2013.01); *H04S 3/008* (2013.01); *H04S 7/30* (2013.01); *H05B 47/18* (2020.01); *H03F 2200/03* (2013.01); *H04S 2400/01* (2013.01); *H04S 2400/11* (2013.01)

(56) References Cited

U.S. PATENT DOCUMENTS

| | | | |
|---|---|---|---|
| 8,416,017 B2 | 4/2013 | Kohut | |
| 8,508,300 B2 | 8/2013 | Lee | |
| 8,559,655 B2 | 10/2013 | Mihelich | |
| 9,100,760 B2 | 8/2015 | Tackett | |
| 9,179,236 B2 | 11/2015 | Robinson | |
| 9,191,737 B2 | 11/2015 | Subat | |
| 9,872,091 B2* | 1/2018 | Aggarwal | H04R 1/02 |
| 2004/0184619 A1 | 9/2004 | Inagaki | |
| 2007/0138660 A1 | 6/2007 | Guo | |
| 2008/0056507 A1* | 3/2008 | Logvinov | H04B 3/54 |
| | | | 381/77 |
| 2008/0253577 A1* | 10/2008 | Eppolito | H04S 7/40 |
| | | | 381/17 |
| 2009/0220110 A1 | 9/2009 | Bazarjani | |
| 2010/0123876 A1 | 5/2010 | Furihata | |
| 2011/0009987 A1* | 1/2011 | Seefeldt | H03G 9/005 |
| | | | 700/94 |
| 2012/0121105 A1 | 5/2012 | Holladay | |
| 2013/0070930 A1* | 3/2013 | Johnson | H04R 29/00 |
| | | | 381/57 |
| 2013/0329912 A1 | 12/2013 | Krishnaswamy | |
| 2014/0140540 A1 | 5/2014 | Staal | |
| 2014/0214431 A1 | 7/2014 | Vinton | |
| 2014/0270264 A1* | 9/2014 | Wang | H04R 1/028 |
| | | | 381/120 |
| 2014/0301570 A1* | 10/2014 | Morriss | H03F 3/183 |
| | | | 381/107 |
| 2015/0223002 A1 | 8/2015 | Mehta | |
| 2015/0271620 A1 | 9/2015 | Lando | |
| 2015/0327815 A1 | 11/2015 | Hwang | |
| 2015/0350804 A1* | 12/2015 | Crockett | H04S 5/005 |
| | | | 381/307 |
| 2016/0127847 A1* | 5/2016 | Shi | G10L 19/008 |
| | | | 381/22 |
| 2016/0255437 A1* | 9/2016 | Wen | F21K 9/23 |
| | | | 381/300 |
| 2018/0077491 A1* | 3/2018 | Butler | H04R 3/12 |

FOREIGN PATENT DOCUMENTS

| | | |
|---|---|---|
| CN | 103856851 | 6/2014 |
| CN | 204928211 | 12/2015 |
| EP | 2790322 | 10/2014 |
| EP | 2849341 | 3/2015 |
| WO | 2007/0112423 | 10/2007 |
| WO | 2008/0097159 | 8/2008 |
| WO | 2015/0105788 | 7/2015 |

\* cited by examiner

US 11,290,819 B2

DISTRIBUTED AMPLIFICATION AND CONTROL SYSTEM FOR IMMERSIVE AUDIO MULTI-CHANNEL AMPLIFIER

FIELD OF THE INVENTION

One or more implementations relate generally to distributed amplification control and signal/power transmission systems for audio power amplifiers used in cinema and other applications.

BACKGROUND

Cinema sound has undergone significant changes with the advent of digital audio, digital cinema, and new immersive audio formats, such as Dolby Atmos®. Many channels of audio are now available for playback through extensive arrays of speaker in many large cinema environments. The Dolby Atmos format comprises audio objects and beds (channel-based audio) where the audio objects can be considered as groups of sound elements that may be perceived to emanate from a particular physical location or locations in the listening environment. Such objects can be static (stationary) or dynamic (moving). Audio objects are controlled by metadata that defines the position of the sound at a given point in time, along with other functions. When objects are played back, they are rendered according to the positional metadata using the speakers that are present, rather than necessarily being output to a predefined channel. In an immersive audio decoder, the channels are sent directly to their associated speakers or down-mixed to an existing speaker set, and audio objects are rendered by the decoder in a flexible manner. The parametric source description associated with each object, such as a positional trajectory in 3D space, is taken as an input along with the number and position of speakers connected to the decoder. The renderer utilizes certain algorithms to distribute the audio associated with each object across the attached set of speakers. The authored spatial intent of each object is thus optimally presented over the specific speaker configuration that is present in the listening environment.

Dolby Atmos installations typically require a format-specific renderer or sound processor, such as the Dolby Cinema Processor 850 (CP850) or similar component, as well as height mounted speakers or speakers capable of reproducing height cues, such as reflective speakers that project sound upwards to reflect off of the ceiling. Present generations of sound processors support up to 128 discrete audio tracks and up to 64 unique speaker feeds, and can be used for both commercial cinema as well as home cinema use. In addition to playing back a standard 5.1 or 7.1 surround-sound mix using loudspeakers grouped into arrays, an immersive audio system can also give each loudspeaker its own unique feed based on its exact location, thereby enabling many new front, surround, and ceiling-mounted (height-cue) channels.

FIG. 1 illustrates an example cinema environment having a surround sound speaker array as presently known. As shown in FIG. 1, a cinema or similar audio/visual (A/V) listening environment 110 has a screen 112 and a set or array of speakers placed around the periphery of the listening environment 110 in any appropriate surround sound arrangement, such as 5.1, 7.1, 9.1 and so on. For the example of FIG. 1, speakers 114 may be Left (L), Center (C), Right (R) speakers along with a low frequency effects (LFE) speaker, and speakers 108 may be surround speakers in any appropriate configuration. For immersive audio playback, speakers 108 may also include overhead mounted height speakers. In a typical cinema or A/V application, the audio content is provided by projector 102 through a sound processor 104 and then to power amplifiers 106 to drive the speakers through individual speaker feeds. As shown in FIG. 1, a large number of 2-channel power amps 206 are typically used to power a cinema (depending on venue size) and create power consumption, hardware complexity, and heating issues in often small control booths.

Traditional theatres, such as shown in FIG. 1 are typically able to reproduce a maximum of eight individual tracks of surround sound among various surround-sound speakers. A 7.1 surround system provides three front channels up front (left, right and center), two side surround channels (left and right), two rear channels (left and right) and one subwoofer channel. A Dolby Atmos is capable of processing 128 channels of sound, which can be routed to up to 64 individual speakers. The ceiling mounted or height cue speakers work with all of the other speakers so that an audio object can be placed just about anywhere within the listening environment. In this way, a sound can be placed in one speaker and panned around to any of the other speakers in the room, instead of being played through one set of surround speakers.

At present, fully enabled immersive audio theatres are still not common. The vast majority of theatres and cinema venues use standard surround-sound playback systems and have the corresponding rendering, amplification, loudspeakers, and cabling components installed. Upgrading to an immersive audio format, such as Atmos, can present a significant investment of time and money as these components need to be upgraded or modified and then installed, such as additional height speakers that must be installed along with the required cabling. Upgrading to this new format is desirable as new content is released using immersive audio and audience demand increases. However, the full implementation of an immersive audio system can represent a substantial upgrade project for older cinemas and venues. What is needed, therefore, is a system that minimizes the cost and effort to upgrade to an immersive audio playback system in commercial venues.

Significant developments have been made with regard to immersive audio sound processors, such as the CP850. To improve the performance and efficiency of these renderers, new amplifiers are being developed to optimize the power management and speaker control of this new format. New developments have also allowed cinema lighting to be powered and controlled through the renderer/amplifier stages so that house lights and mood/ambient lights within the venue can be synchronized and controlled with the audio through the same power circuits and cabling as the audio signals. In present installations, UL-rated lights must be used and such lights often require two or more fixtures to work in conjunction with the cinema playback controls, and are controlled separately from the AV content. The amount of data processing provided by immersive audio systems enables lights to be controlled in the same manner and using the same hardware installations and power busses as the speakers. What is further needed, therefore, is an efficient way to transmit power and data over a comprehensive playback system having immersive audio content and lighting controls.

In WO2007112423 (A2), an intelligent audio speaker that uses a power line communication element to provide audio distribution within homes, businesses, apartment complexes, and other buildings is described. Multiple intelligent audio speakers may be networked together, with common control. The intelligent audio speaker may contain enhanced ambient backlight effects.

US2004184619 (A1) describes a sound control system including a plurality of electronic devices connected to a communication network, each of the electronic devices being capable of independently producing sound from connected speakers, and a sound control device transmitting control signals for controlling the electronic devices and audio signals to the electronic devices via the communication network. Each electronic device includes receiving means for receiving the control signals and the audio signals via the communication network, and selecting means for switching from other external signals to the audio signals in response to the control signals in order to drive the speakers by only the audio signals output to the speakers.

US2007138660 (A1) describes a method and system for generating olfactory and tactual effects in combination with the visual and auditory effects in motion pictures. When a film is being projected, olfactory signals are detected by the multi-channel device in the film projector and are transmitted to an odor-control electromagnetic valve, which sends the pressurized odor to the multi-functional emission box via pressure relief valve until the odor is released into the inside of cinema in synch with the development of the film plots. During film projection, tactual signals are detected by the multi-channel device of the film projector and are transmitted to a water-control electromagnetic valve, which sends water to a sprinkler head or a fog-spraying head to simulate the effects of raining, sneezing, and other effects in synch with the development of film plots. Tactual signals can also be used to actuate vibrators installed in audience seats to produce the effects of shaking and bumping.

In U.S. Pat. No. 3,683,100 (A), wall panels capable of transmitting both power and signal energy are presented. A.C. power from a conventional outside source is supplied to a power transformer which steps it down to some lower level. Signal energy may be derived from video modulators such as videotape recorders, video disc recorders or any video source equipment, data or computer modulators, audio sources. This signal energy is supplied through a signal combiner and a directional filter and coupler to a signal-power interface component.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are directed to system having a power source outputting power to drive speakers and lights in a venue, a control unit coupled to the power source and outputting multi-channel digital audio data to the speakers and light control data to the lights, and a unitary transmission bus coupling the output of the power source to the speakers and the lights and transmitting the power, the digital audio data, and the light control data over a common conductor of the bus to the speakers and the lights. The system further has a speaker unit associated with each speaker configured to receive or recover the power to drive the associated speaker and transmit an appropriate channel of the multi-channel digital data to the associated speaker, and a light unit associated with each light and configured to decode the light control data to light the associated light. In other words, the light unit is configured to control the associated light in accordance with the light control data. The system further comprises an interface to a renderer including an immersive audio sound processor associating metadata encoding the light control data and parametric trajectory information for the digital audio with speaker feeds for multi-channel digital audio. The unitary transmission bus may comprise a single multi-conductor cable having two or three conductors of 10 to 20 gauge speaker wire, and wherein a third conductor comprises an earth ground in the case where the multi-conductor cable comprises three conductors. The light may be main venue light and a mood light, and may be embodied in a multi-colored light emitting diode.

In an embodiment, the digital audio data and light control data is transmitted using an Internet Protocol (IP) transmission, or other communications protocol, and wherein audio data comprises at least in part immersive audio content having channel-based audio and object-based audio. More specifically, the control unit may be configured to output the digital audio data comprising at least in part immersive audio content having channel-based audio and object-based audio. The unitary transmission bus may be configured to transmit the digital audio data and light control data using an Internet Protocol (IP) transmission.

The system further has an interface to a renderer including an immersive audio sound processor associating metadata encoding the light control data and parametric trajectory information for the object-based audio with speaker feeds for the multi-channel digital audio data. The light control data is synchronized with the multi-channel digital audio data so that illumination of the venue and mood lights can be controlled directly in relation to the audio data. The lights and speakers may be packaged in fixtures containing at least one speaker and at least one light within a single cabinet.

In an embodiment, the control unit comprises part of an audio amplifier having: a power supply stage coupled to a mains power supply and providing power to drive channels corresponding to speaker feeds to the speakers, a monitor component coupled to the power supply stage and monitoring environmental and operating characteristics of the amplifier, and a power controller coupled to the monitor component and adjusting per-channel gain values based on the mains power supply and the environmental and operating characteristics of the amplifier.

Embodiments are further directed to a method comprising encoding multi-channel digital audio data to be transmitted within a first transmission band and power to be transmitted within a second transmission band to drive speakers for playback of the audio data in a venue, encoding lighting control data to be transmitted within a third transmission band to power lights in the venue, transmitting the digital audio data, power, and lighting control data over a single transmission bus to the speakers and lights, and at each speaker, recovering the power to drive the speaker and decode the data to playback a specific channel of the multi-channel digital data through the speaker so that different source content is played back through each speaker of the plurality of speakers, and at each light, decoding the lighting control data to illuminate the light to an appropriate intensity and color. The method may further comprise generating speaker feeds from a power supply stage coupled to a mains power supply and providing power to drive channels corresponding to the speaker feeds to the speakers, monitoring environmental and operating characteristics of the power supply stage, and adjusting per-channel gain values based on the mains power supply and the environmental and operating characteristics of the amplifier. It may yet further comprise monitoring operating conditions of the speakers, and adjusting the per-channel gains to compensate for any fault in any of the speakers. The environmental and operating characteristics may comprise at least one of: voltage of the mains power supply, mains circuit breaker rating, temperature of the power supply stage, and load of the speaker feeds. The power supply stage provides maximum voltage and current on each channel of the speaker feeds under normal operating conditions and according to current and voltage availability of the mains power, and the method further comprises reducing the gain to at least one of the channels in the event of a negative environmental or operating condition. In an embodiment, the lighting control data comprises metadata superimposed over the digital audio data and power.

Embodiments are yet further directed to methods of making and using or deploying the amplifier, speakers, and renderer designs provide distribution of digital audio, lighting control, and power to drive speakers and lights over a single bus in an immersive audio playback system.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
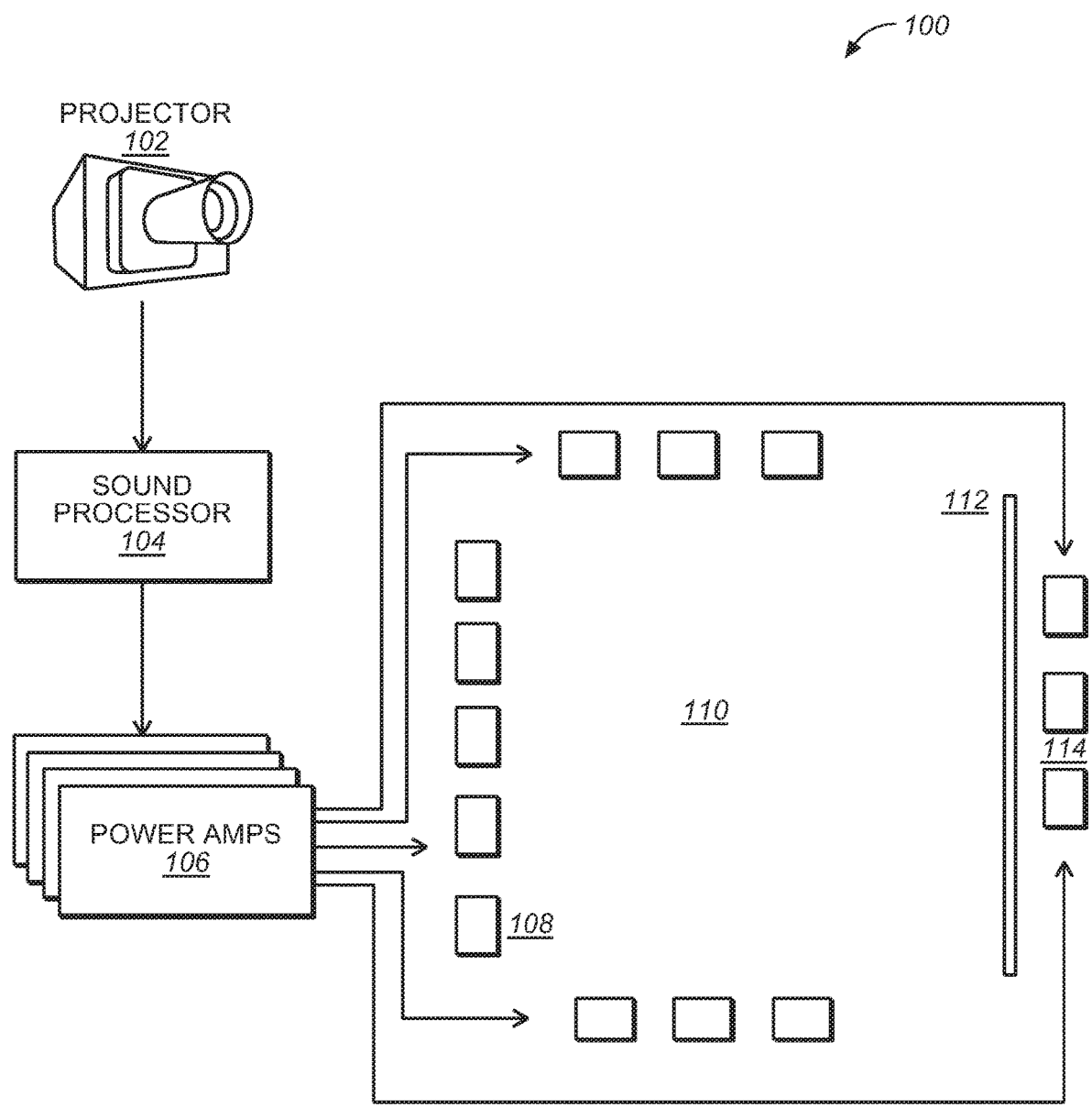
FIG. 1 illustrates an example cinema environment having a surround sound speaker array as presently known.

Systems and methods are described for an integrated cinema amplifier and renderer system having a power supply stage that distributes power over a plurality of channels for rendering immersive audio content in a surround sound listening environment. The amplifier automatically detects maximum and net power availability and requirements based on audio content by decoding audio metadata and dynamically adjusts gains to each channel or sets of channels based on content and operational/environmental conditions. A transmission format transmits lighting data along the same bus as power and audio content to synchronize lighting controls with audio content. The multi-channel amplifier includes a power stage powering cinema lights and integrated speaker lights to provide lighting power and control signals over same power subsystem and connectors as power and audio lines. The amplifier may include redundant power supplies or a multiphase power sub-system, and a monitor to monitor the health of the power supplies, and shut down one if an error condition is detected and utilize the remaining power supply to power the unit. The amplifier circuit samples the audio performance of the theatre on a regular basis and detects and predicts speaker issues, such as a drop in performance or a blown/malfunctioning speaker.

Aspects of the one or more embodiments described herein may be implemented in an audio or audio-visual (AV) system that processes source audio information in a mixing, rendering and playback system that includes one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

For purposes of the present description, the following terms have the associated meanings: the term "channel" means an audio signal plus metadata in which the position is coded as a channel identifier, e.g., left-front or right-top surround; "channel-based audio" is audio formatted for playback through a pre-defined set of speaker zones with associated nominal locations, e.g., 5.1, 7.1, and so on (i.e., a collection of channels as just defined); the term "object" means one or more audio channels with a parametric source description, such as apparent source position (e.g., 3D coordinates), apparent source width, etc.; "object-based audio" means a collection of objects as just defined; and "immersive audio," (alternately "spatial audio" or "adaptive audio") means channel-based and object or object-based audio signals plus metadata that renders the audio signals based on the playback environment using an audio stream plus metadata in which the position is coded as a 3D position in space; and "listening environment" means any open, partially enclosed, or fully enclosed area, such as a room that can be used for playback of audio content alone or with video or other content, and can be embodied in a home, cinema, theater, auditorium, studio, game console, and the like.

Embodiments are directed to a sound processing and amplification system that is configured to work with a sound format and processing system that may be referred to as an immersive audio system that is based on an audio format and rendering technology to allow enhanced audience immersion, greater artistic control, and system flexibility and scalability. Such a system generally comprises an audio encoding, distribution, and decoding system configured to generate one or more bitstreams containing both conventional channel-based audio and object-based audio. An example of an adaptive audio system that may be used in conjunction with present embodiments is described in U.S. Provisional patent application Ser. No. 61/636,429, filed on Apr. 20, 2012 and entitled "System and Method for Adaptive Audio Signal Generation, Coding and Rendering."

An example immersive audio system and associated audio format is the Dolby Atmos platform. Such a system incorporates a height (up/down) dimension that may be implemented as a 5.1, 7.1, 9.1 surround system, or similar surround sound configuration (e.g., 11.1, 13.1, 19.4, etc.). A 9.1 surround system may comprise composed five speakers in the floor plane and four speakers in the height plane. In general, these speakers may be used to produce sound that is designed to emanate from any position more or less accurately within the listening environment. Though immersive audio (such as Atmos) may have been originally developed for movie programs played in cinema environments, it has been well adapted for home audio and smaller venue applications. Embodiments are generally described with reference to cinema or large theatre applications, but should be understood to apply equally well to home or smaller scale applications as well.

Figure 2A:
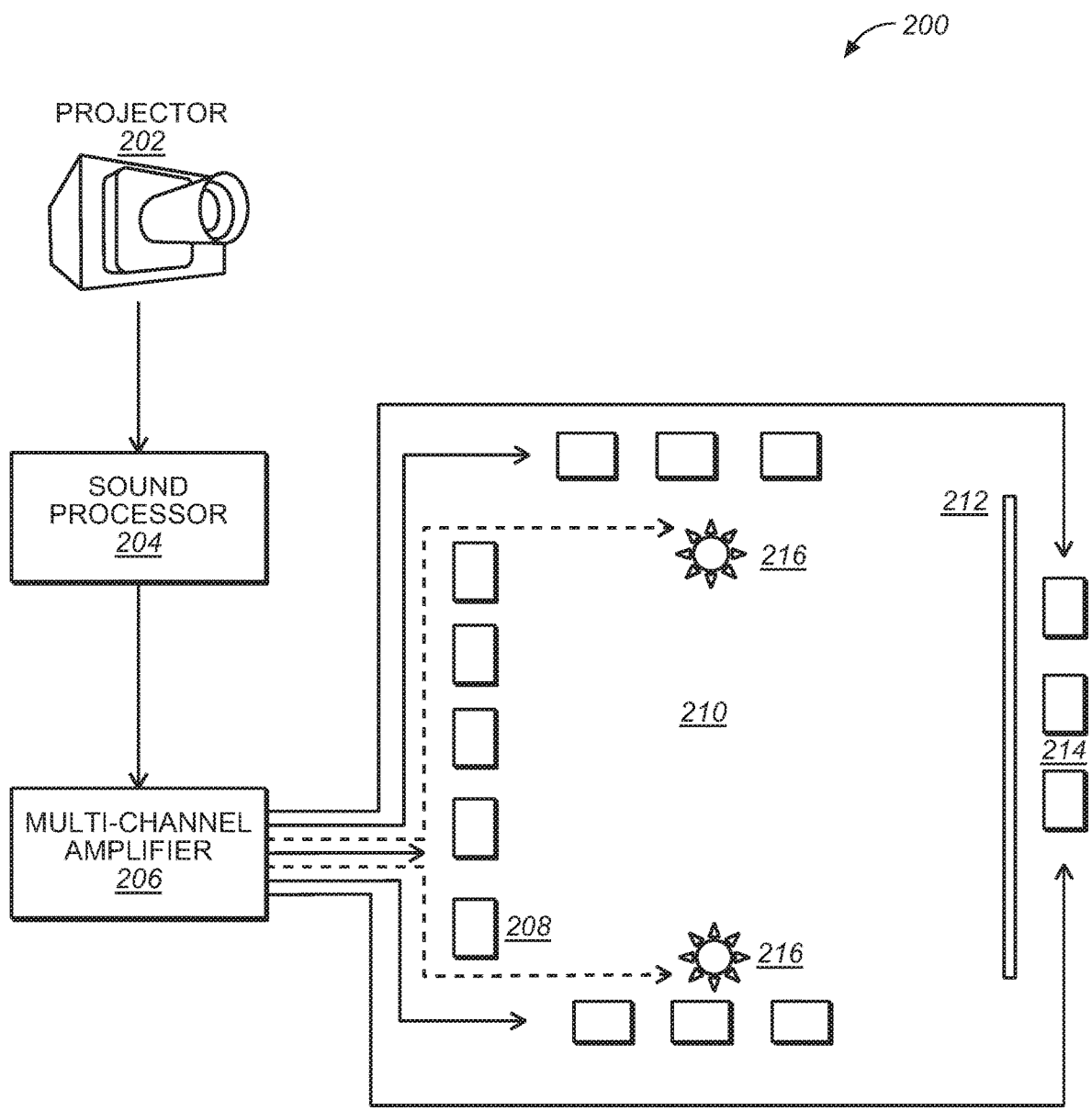
FIG. 2A illustrates a cinema environment having a surround sound speaker array powered by a multi-channel power amplifier under some embodiments.

FIG. 2A illustrates a cinema environment having a surround sound speaker array powered by a multi-channel power amplifier under some embodiments. As shown in FIG. 2A, a cinema or similar audio/visual (A/V) listening environment 210 has an array of speakers 208 and 214 placed around screen 212 and the listening environment in any appropriate surround sound arrangement (e.g., 5.1, 7.1, 9.1, etc.). The audio content is provided by projector 202 through a sound processor 204 and then to a multi-channel amplifier 206. Multi-channel amplifier 206 drives the speakers 208 and 214 through individual speaker feeds, and in contrast to the array of multiple individual amplifiers 106 shown in FIG. 1, it is a single unitary amplifier unit. In an embodiment, it is provided as a single component occupying just one-half height rack (19" rack mount) when installed in an A/V booth of a cinema.

In an embodiment, amplifier 206 also includes circuitry to power the main theatre lights 216 and optional mood or ambient lights that may be placed throughout the theatre. This power can be transmitted over the speaker wires, and the lights may be standard theatre lighting or specially designed modules, such as multi-colored LED arrays placed in appropriate locations of the listening area 210. In an alternative embodiment, the lights can be integrated in at least some of the speaker cabinets.

Figure 2B:
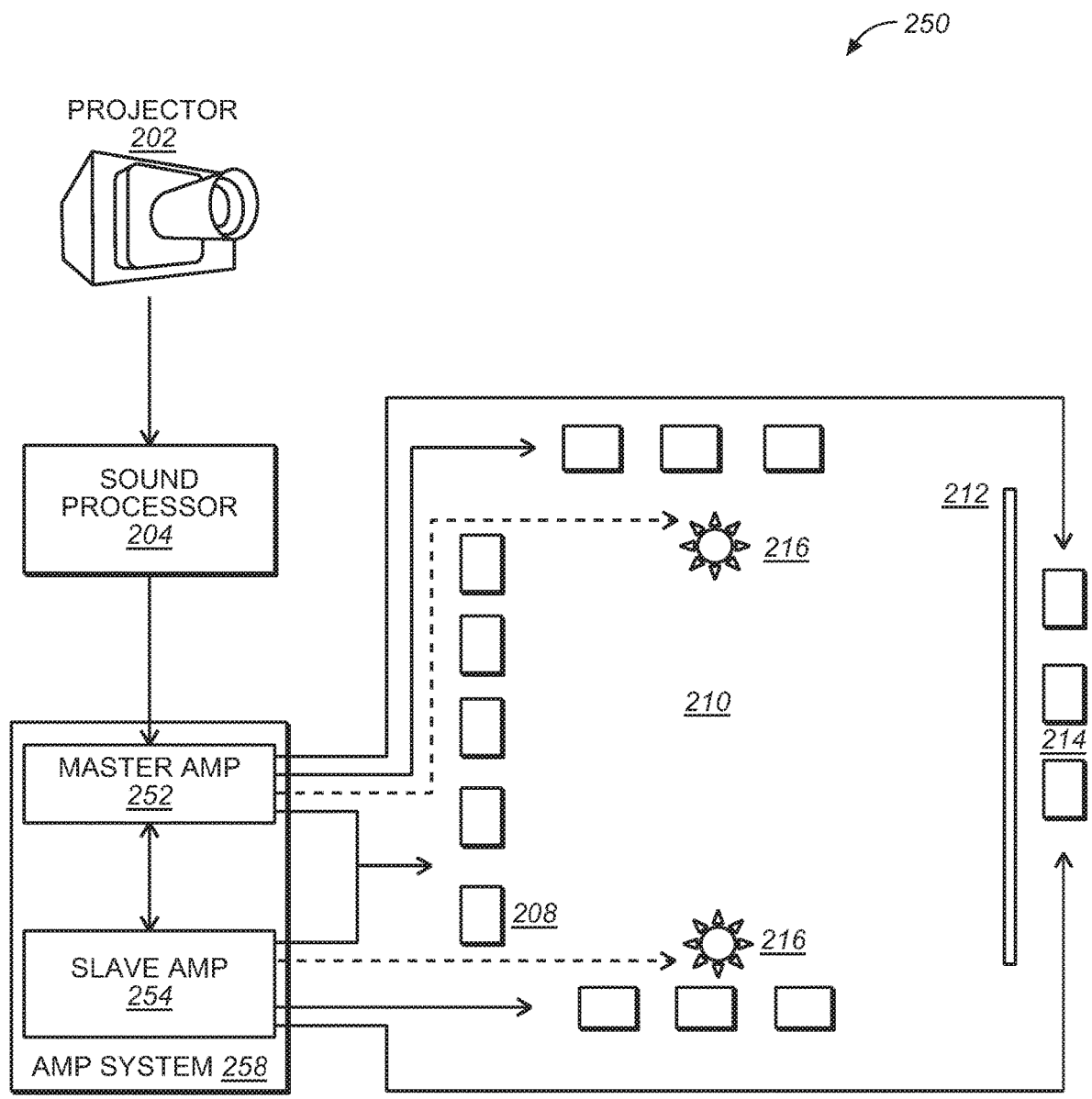
FIG. 2B shows two or more amplifiers connected together to form a master/slave configuration under an alternative embodiment.

For the embodiment of FIG. 2A, the amplifier 206 may be a single unitary amplifier. FIG. 2B shows an alternative embodiment in which two or more amplifier may be connected together in a serial or daisy-chain fashion so that an amplifier system is formed having a master/slave configuration. FIG. 2B illustrates the system of FIG. 2A in which an amplifier system 258 comprises two amplifiers 252 and 254 coupled together serially to form a master/slave amp system in which the two amplifier work together to power different speakers and or lights of the listening environment 210, or in which they provide increased power capacity for the entire system (e.g., 600 w together instead of 300 w for a single amp), or redundancy functions in case of a failure or fault conditions. The amplifiers 252 and 254 may be connected over an AES67 interface or similar amplifier interface. For the embodiment of FIG. 2B, the master/slave amps are configured such that one amp 252 drives the lights and speakers on one side of the cinema 210, while the other amp 254 drives the lights and speakers on the other side of the cinema. Many other configurations are also possible such as having one amp drive only the lights or only the speakers, or having one amp drive the passive speakers (e.g., the surround speakers 208) and the other amp drive the powered speakers (e.g., the behind screen speakers 214), or having different amps drive different sets of interleaved speakers, etc. In an embodiment, the number of channels is increased by the each individual amplifier, such as 2×24 channels for a total of 48 channels for two amps in amp system 258. Alternatively, the master/slave amps may be configured such that number of channels remains the same, but the power overhead for each channel increases through the additional amplifier, or any other similar combination of channel and/or power overhead increase.

Although embodiments of FIG. 2B are shown with two amps 252 and 254, it should be noted that any practical number of amplifiers may be provided with a single master amp or amp array driving one or more slave amps.

For an embodiment in which an analog amplifier may be available to power the speakers, such as an older cinema installation, the amp system may be coupled to the analog amp through a digital-audio-converter (DAC) to convert the digital signals from the renderer or sound processor 204 into the requisite analog signals for the analog amp.

Figure 3:
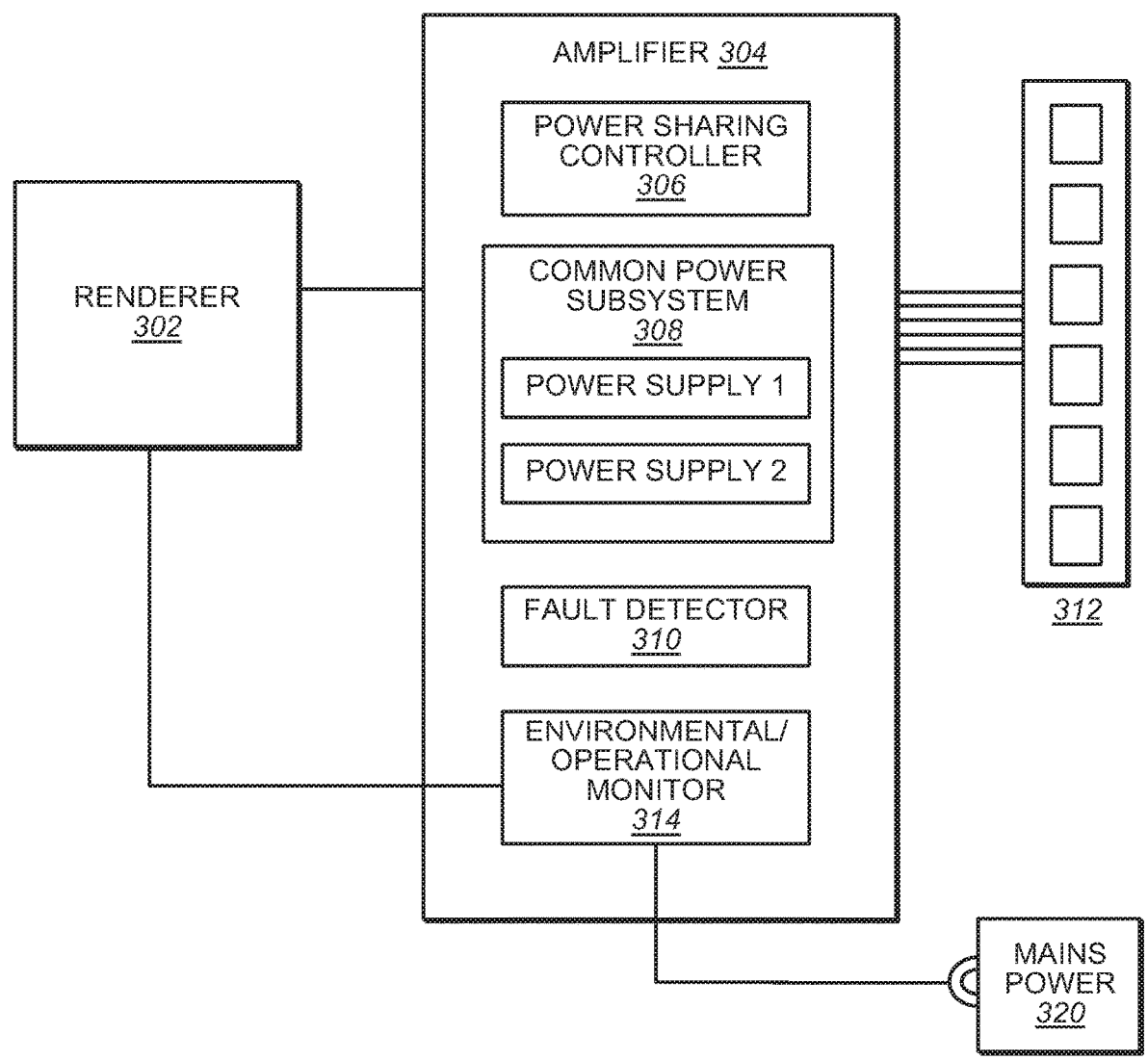
FIG. 3 is a block diagram illustrating main functional components of a multi-channel amplifier, under some embodiments.

FIG. 3 is a block diagram illustrating main functional components of a multi-channel amplifier, under some embodiments. For the system of FIG. 3, audio signals from renderer 302 are amplified in amplifier 304 and transmitted to speaker array 312.

In an embodiment, the speakers 312 of FIG. 3 are configured and placed to playback immersive audio content in which audio signals being presented to the listener originate from in front of and around the listening position in the horizontal plane (main speakers) and overhead plane (height speakers). A full loudspeaker system layout may consist of: front loudspeakers (e.g., Left, Center, Right, and optionally Left Center Right Center, Left Screen, Right Screen, Left Wide, and Right Wide), Surround loudspeakers (e.g.: Left Surround, Right Surround, and optionally Left Surround 1, Right Surround 1, Left Surround 2, Right Surround 2), surround back loudspeakers (e.g., Left Rear Surround, Right Rear Surround, Center Surround, and optionally Left Rear Surround 1, Right Rear Surround 1, Left Rear Surround 2, Right Rear Surround 2, Left Center Surround, Right Center Surround), height loudspeakers (e.g., Left Front Height, Right Front Height, Left Top Front, Right Top Front, Left Top Middle, Right Top Middle, Left Top Rear, Right Top Rear, Left Rear Height, Right Rear Height), and subwoofer speakers. This represents one example of a speaker configuration, and other configurations are also possible.

Component 302 generally represents an audio component that is generally referred to as a "renderer." Such a renderer may include or be coupled to a codec decoder that receives audio signals from a source, decodes the signals and transmits them to an output stage that generates speaker feeds to be transmitted to individual speakers in the room. In an immersive audio system, the channels are sent directly to their associated speakers or down-mixed to an existing speaker set, and audio objects are rendered by the decoder in a flexible manner. Thus, the rendering function may include aspects of audio decoding, and unless stated otherwise, the terms "renderer" and "decoder" may both be used to refer to an immersive audio renderer 302, such as shown in FIG. 3, and in general, the term "renderer" refers to a component that transmits speaker feeds to the speakers, which may or may not have been decoded upstream. In an embodiment, the AVR or renderer/decoder 305 of FIG. 3 comprises an audio/video receiver for use in home entertainment environments (home theater, home television, etc.). The AVR generally perform multiple functions. First, it provides a connection point for multiple source devices, and the AVR is responsible for switching among the inputs, and second, it performs audio decoding and processing (e.g., surround sound processing, Dolby Pro Logic™ processing, Dolby Digital™ processing, Dolby TrueHD™ processing, etc.). It may also provide amplification or pre-amplification for speakers. For the embodiment of FIG. 3, the amplification to drive the speakers 312 is provided by power amplifier 304.

In an embodiment, amplifier 302 is a multi-channel, Class-D amplifier that comprises main functional components of a power sharing controller 306, a power subsystem 308, and a fault detector 310. An environmental/operational monitor 314 may be provided as part of the amplifier or as a separate component that provides certain operating and environmental condition data to the amplifier. Amplifier 314 is preferably packaged in a single housing to provide a unitary component that works with a compatible renderer or sound process with respect to providing a number of separate channels (e.g., 24 channels) for playback of immersive audio content.

In an embodiment, the amplifier 304 provides power sharing or power steering of the common power sub-system 308 across all of the channels of a multi-channel speaker output stage. In an example configuration, up to 24 channels may be supported, but other possible embodiments are not so limited. The power subsystem 308 may utilize two redundant power supplies (e.g., connected in series or parallel), though other single or multi-power supply configurations are also possible. The power supplies are redundant in that failure of one supply will cause the other supply to kick in and provide power to the amplifier. The fault detector 310 monitors the status of the power subsystem 308 and detects the health of the power supplies. It is configured to shut down a failing supply if an error is detected and utilize the remaining power supply to power the unit. In an embodiment, the power supplies may be configured to run in parallel so that either supply can provide full power, or they can be run in parallel with each supply providing half the power. In this case, failure of one supply may cause audio to play at half the available power (e.g., 41V instead of a full 82V), but this prevents the condition where no audio is available in the case of a power failure.

In an embodiment, the power supply stage may comprise a plurality of individual power supplies configured in a multiple phase architecture, where the different power supplies are designed to operate with different phase angles and sum into a unified output. This embodiment uses multiple power supplies at different phase angles that are then summed at the outputs to form a singular output. This technique improves power conversion efficiency, evenly distributes thermal dissipation, and allows redundancy within the power supply stage.

In an embodiment, the internal or external environmental/operational monitor 314 periodically samples the audio performance of the theatre or cinema 210 on a regular basis and detects and predicts speaker issues, such as a drop in performance, a blown speaker or one that has introduced rub/buzz. The amplifier is configured to shut that channel down and notify the renderer 302 to re-render the content, mapping out that faulty speaker and use the other speakers to compensate for the failed or missing speaker. It can also detect non-speaker performance issues, such as rub and buzz, in a fixture or tile in the theatre. This information may be accommodated through re-rendering, or it can be reported to system administrators or personnel.

In an embodiment, the power supply is designed to allow the system to operate from a normal 120 VAC 20 Amp service without blowing the AC mains circuit breaker. To this end, feedback from the power supply shall be available from the power supply to signal the system that the maximum output is being reached so as to allow the amplifier to scale-back processing to eliminate an over current condition on the mains supply. The amplifier is also configured to operate a wide range of possible supply voltages based on country of use or local power supply variations. For example, mains power can vary from a low of 100V in Japan to a high of 240V in Australia. The setting of 240V at 20 amps thus represents the maximum power that the amp can deliver without tripping any circuit breakers in an installation, and this maximum power output is tailored for each different installation. The monitor 314 and controller 306 components provide the maximum power delivered based on the input power available.

As shown in FIG. 3, the monitor component 314 is coupled to the mains power 320, which represents a circuit breaker and power junction to the cinema or building power supply. Through this component, the amplifier is configured to detect the power supply levels provided by the mains power and to adjust the power delivered to the speakers 312 accordingly. The range of mains power can vary depending on country, or facility configuration (such as in buildings with selectable voltages), and the amplifier can be configured to accommodate a wide range of AC voltages, such as between 85-265 VAC at any appropriate phase and current. Maximum power levels can be programmed into the amplifier through user input using known supply ratings and circuit breaker ratings, such as may be provided during a configuration or installation operation. Alternatively, these values can be determined dynamically by the use of test signals and test voltages such as to deliberately reset/set the breaker to determine maximum voltage levels, or by reading relevant parameters from enabled intelligent power supply devices.

The power supply is designed to allow the system to operate from a normal (e.g., 120 VAC 20 Amp) service without blowing the AC mains circuit breaker. Feedback from the power supply is made available from the power supply to signal the system that the maximum output is being reached so as not to allow the amplifier to scale back processing to eliminate an over-current condition on the mains supply. Certain control signals are made available to the system controller 306 for this purpose, such as 95% power level reached, power fail indication, and power good.

Figure 4A:
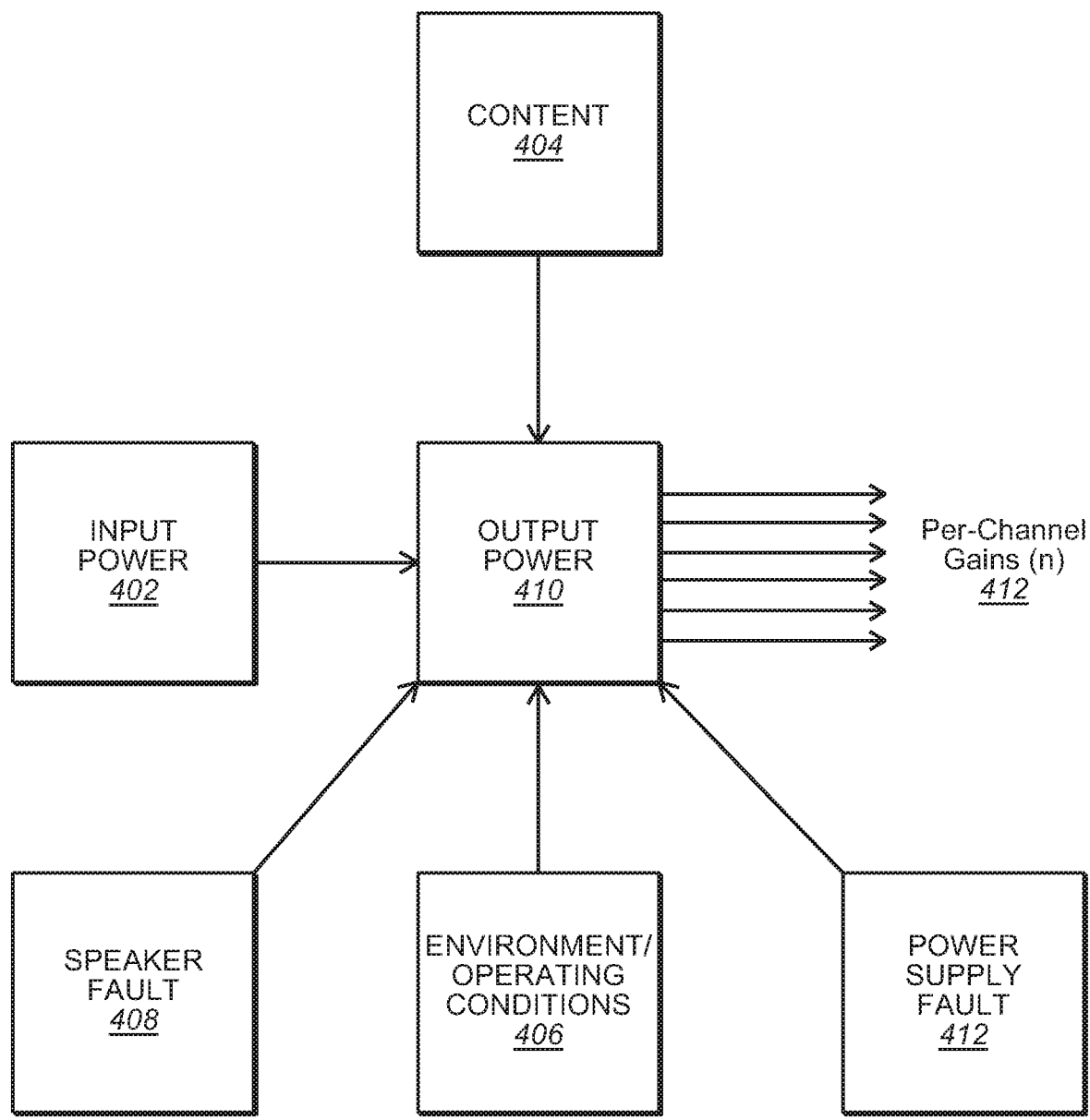
FIG. 4A illustrates the generation of per-channel gain levels based on certain amplifier operating characteristics, under some embodiments.

In an embodiment, amplifier 304 manages the gain of each individual channel based on certain environmental and operating conditions, as monitored by the fault detector 310 and environmental/operational monitor 314. FIG. 4A illustrates the generation of per-channel gain levels based on certain amplifier operating characteristics, under some embodiments. As shown in FIG. 4A, the per-channel gains 412 are derived from the output power 410 provided by the amp on each of the channels 1-*n*, where n is any appropriate number of channels, such as provided by the renderer 302. In an example embodiment in which the renderer corresponds to a Dolby Atmos Cinema Processor (CP850) or similar renderer, 24 audio channels are output from the renderer and amplified individually by amplifier 304. The output power 402 is a function of several inputs including the input power 402, the audio content 404 and the environmental/operational conditions 406. As described above, the input power 402 comprises the AC mains power voltage 320 and the current delivery and circuit breaker threshold. These values can be sensed by the amplifier and/or input into the amp by technician as part of amplifier installation and setup process. The input power 402 dictates the maximum amount of output power 410 that can be provided, and hence the maximum per-channel gain values 412 that are available to each of the channels individually and collectively. As also described above, the per-channel gains can also be set or modified depending on any speaker fault conditions detected by the fault detector 310. In the case of any failing or failed speakers, speaker cables, output stage, or any other specific channel component, power to that channel may be attenuated or cut and other channels boosted accordingly to compensate. The amplifier circuit may thus be configured to periodically sample the audio performance of the theatre on a regular basis and detect and predict speaker issues, such as a drop in performance or a blown/malfunctioning speaker.

In an embodiment, the output power 410 is also determined by the state of the two (or possibly more) redundant power supplies in the power subsystem 308 of amplifier 304. The controller 306, or other monitor component monitors the health of the power supplies and shuts down or ramps down the active power supply if an error condition is detected. It then switches in the remaining power supply to power the unit. In certain cases where the second amplifier is also malfunctioning, total power to the amp may come from both amplifiers or one of the suboptimal amps, in which case the total output power 410 may be reduced from the optimum level. In this case, the per-channel gains 412 may be altered to compensate for the failing power supplies.

For the embodiment of FIG. 4A, the audio content 404 can also be used to determine the output power 410 for each channel In this embodiment, the renderer provides appropriate data to the amp, such as through immersive audio metadata that is used by the amplifier to adjust the per-channel gains 412 accordingly. For example, certain center or front channels may be amplified greater than surround channels if the audio is primarily dialog rather than music. Such content-dependent gain control can be useful in certain suboptimal conditions, such as when the input power 402 is low so that instead of playing dialog at the same level as music or background audio at equally low levels, the dialog can be enhanced at the expense of the music to make it relatively more intelligible. The amplifier and renderer may be configured to communicate and generate speaker feeds according to a defined time-shift so that the amplifier can adequately process the audio content data and set the gain levels accordingly. For example, the renderer can send content data to the amplifier milliseconds ahead of the actual playback of the signals so that the amplifier has time to set the gain levels prior to sending the speaker feeds to the speakers.

In an embodiment, the monitor component 314 (of FIG. 3) monitors the mains power to provide an indication of any change of input power 402 to the amplifier. Any significant change may necessitate a change in the per-channel gains, such as a decrease in power requiring attenuation of certain channels, and an increase in power allowing for increasing the gain across all channels. The monitor 314 can also monitor other external conditions, such as ambient temperature in the control room or amplifier enclosure so that in a potential overheating situation or dangerous environmental condition, the output power 410 can be reduced or cut to prevent system failure. The operating conditions 406 represent certain internal amplifier conditions, such as current flow to the speakers, temperature on a per-channel basis, power supply health, temperature (thermals or thermal conditions) for the power supplies, load consumption on the speaker feeds, and certain Class-D control loop (modulation monitor) conditions. The amplifier is generally configured to provide full voltage and current on every channel depending on the input power 402 and other optional characteristics such as the content 404 and speaker health 408. In the event of any abnormal internal operating conditions, the output power can be adjusted to compensate for any problems or potential faults. For example, if the power supply thermal temperature is too high or if the speaker loads are too high, power can be cut.

In an embodiment, the controller can be configured or programmed to reduce the gain values by certain defined amounts depending on the compromised or negative condition detected by either fault detector 310, monitor 314, or on the basis of changed audio content from the renderer 302. For example, the per-channel gain for any particular channel or channels can be successively cut by −3 dB until the fault or problem condition is alleviated. Internal feedback loops within the amplifier update the controller with respect to changed operating conditions in response to the changed per-channel gains. For example, in a power supply overheating situation, the controller may cut the gains across all channels until the monitor 314 detects stabilization in the thermal condition. Likewise, if a brown-out condition is detected in which mains power is significantly decreased, the gains may be cut until full power is restored, at which time, the controller may re-elevate the gains to their original levels.

The amplifier may also be programmed to implement specific channel shutdown or switchover procedures in the event of serious problems, such as failure of speakers or input power degradation (e.g., a brown-out or black-out condition). In such a case, for example, heavily loaded channels may be shutdown and all available sound sent to one or a few low power speakers.

The output gains 412 can be set equally for all channels, or individually so that each channel or certain sets of channels have different gain values. In this manner, the per-channel gains can be adjusted to form a hierarchy or prioritized sets of gains. This allows the gains to be increased or decreased based on relevant characteristics such as content in relation to input power, potential failure conditions of speakers or power supply components, speaker loads, current draw, and so on. The order of priority dictates the relative amount of gain assigned on a per-channel basis for each level of priority. For example, with reference to FIG. 2A or 2B, speakers 214 may be assigned priority 1, the rear bank of surround speakers 208 may be assigned priority 2, the L/R banks of surround speakers 208 may be assigned priority 3, and the LFE may be assigned priority 4. In this case, the priority 1 speakers may be the last speakers to be attenuated in case of adverse environmental or operating conditions, while the LFE and side surround speakers would be the first channels to be attenuated or cut. As should be noted, any grouping of channels and desired priority levels may be assigned depending on the capabilities and constraints of the playback system.

Figure 4B:
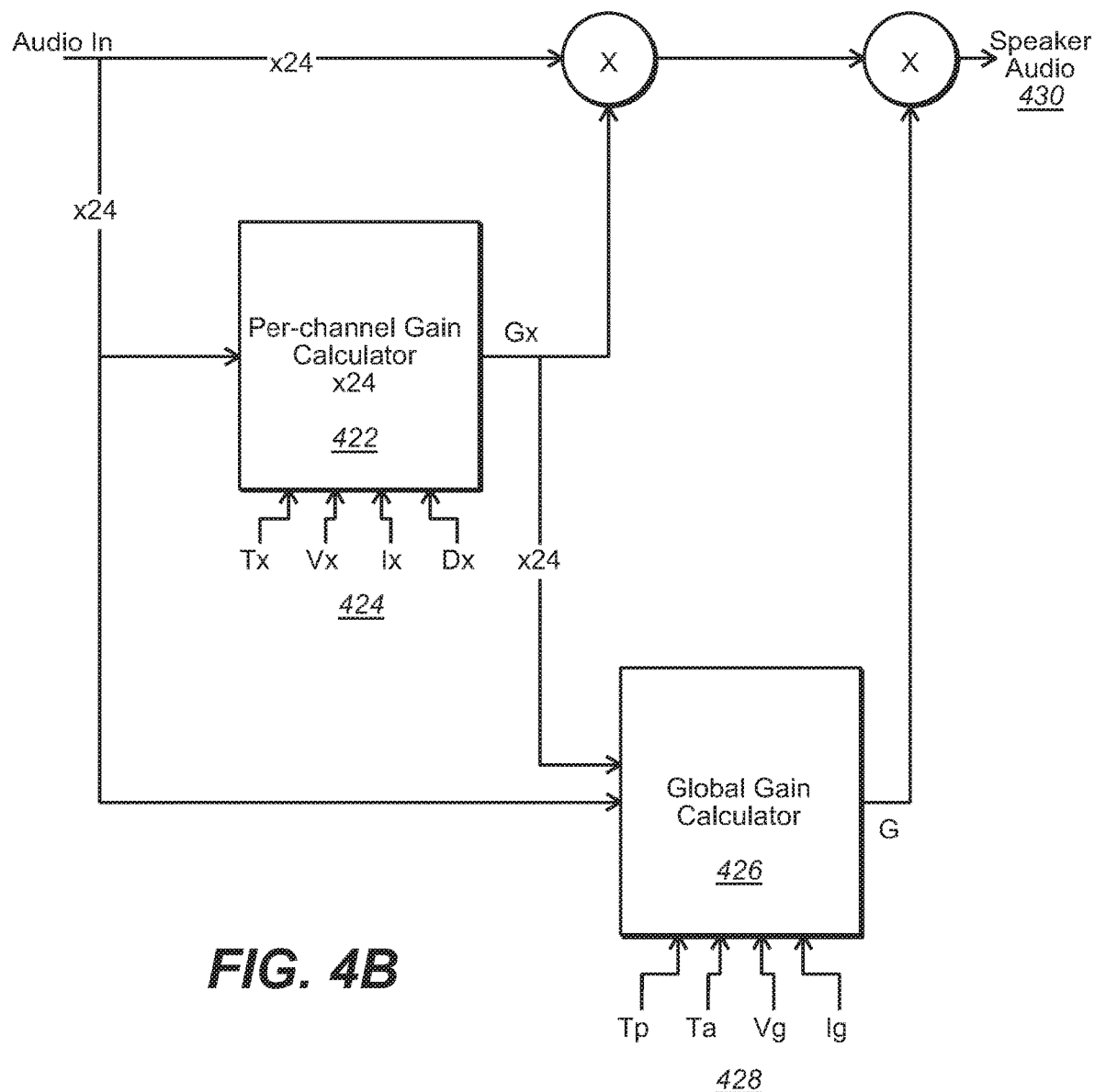
FIG. 4B illustrates calculation of per-channel and global gain values to determine audio output levels for the speaker feeds, under some embodiments.

In an embodiment, the per-channel gain values applied to the channels of the output audio comprise per-channel gains and global (system) gains. FIG. 4B illustrates calculation of per-channel and global gain values to determine audio output levels for the speaker feeds, under some embodiments. As shown in FIG. 4B, the input audio channels (e.g., 24 channels, though other numbers of channels are also possible) are input to a per-channel gain calculator 422 for the n channels and a global gain calculator 426 for the n channels. The per-channel gain calculator receives input parameters 424 from one or more sensors or components within the amplifier and listening environment, such as the fault detector 310 and monitor 314. For the embodiment shown, these input parameters 424 include: Tx, the per-channel amplification stage temperature; Vx, the per-channel voltage, Ix, the per-channel current; and Dx, the PWM duty cycle. The calculated per-channel gains Gx are then input to the global gain calculator 426 along with the audio input signal. The global gain calculator 426 receives input parameters 428 from the appropriate sensors and components. For the embodiment shown, these input parameters 424 include: Tp, the power-stage temperature; Ta, the ambient temperature; Vg, total voltage; and Ig, the total current. The input parameters 424 and 426 represent an example set of characteristics and other similar and appropriate parameters may be used depending on application, content, and environmental conditions.

As shown in FIG. 4B, the per-channel gain values Gx are combined with and applied to each corresponding channel of the audio input signal. The global gain value G from calculator 426 is then applied to the audio signal after the per-channel gains are applied to produce the speaker output channel feeds 430.

In an embodiment, gain adjustments are made according to the following algorithm (where Pr is the recommended power):

Gain adjustments:
If (Ig*Vg>Pr) then global gain (G) can be reduced until Ig*Vg<=Pr
  This can also be done by analyzing the content and dropping Gx for the channels with high peaks.
  Can also do both—dropping the per-channel gain on high-peak channels by a predefined acceptable amount and then dropping the overall gain until Pr
Ta has inverse relation to G. There is a longer time constant to measure and act on this.
Tp has an inverse relation on Pr; i.e., the higher the temperature, the lower recommended power usage will be for the system.
Ix*Vx (channel power) cannot exceed per-channel recommended power (Prx) and the gain (Gx) will be reduced until it does.
Tx has an inverse relation to the per-channel recommended power (Prx).
Dx may be an on/off switch for the channel.

The global gain G represents the power distribution for the system and takes into account ambient and amplifier temperatures and total voltage and current values. The per-channel gains take into account individual channel voltages, currents, and temperatures, as well as the PWM (pulse width modulated) duty cycles. In an embodiment, the power controller adjusts the per-channel gain values based on per-channel characteristics, power distribution characteristics, speaker health characteristics, and mains power supply characteristics.

With regard to speaker health monitoring, the Vx and Ix parameters can be used to provide the frequency response of a speaker (using Fourier transforms) and can help gauge the health of individual drivers. This is done by measuring impedance (Z=V/I) and verifying that it matches the expected curve for the speaker. A system can flag the speaker as "broken" for re-rendering or transmit a user alert, and/or turn off that speaker. Any alert or flag can then be transmitted to a system administrator, theatre staff or NOC (Network Operations Center) for further action. This signal can also be generated for non-speaker performance issues, such as rub and buzz, in a fixture or tile in the theatre.

In an embodiment, the amplifier includes a thermal management system that consists of arrays of main and auxiliary fans, and temperature sensors across all channels, power supplies, and the chassis. Sensor outputs are collected, analyzed and fed back to a thermal controller which controls fan speed across the system. Included in this system is a predictive temperature control apparatus design to adjust future thermal profiles based on known or established environmental behaviors. For example, the adjustment can be made when a predicted temperature profile looks to be ramped beyond a set limit.

Lighting Control

Figure 5:
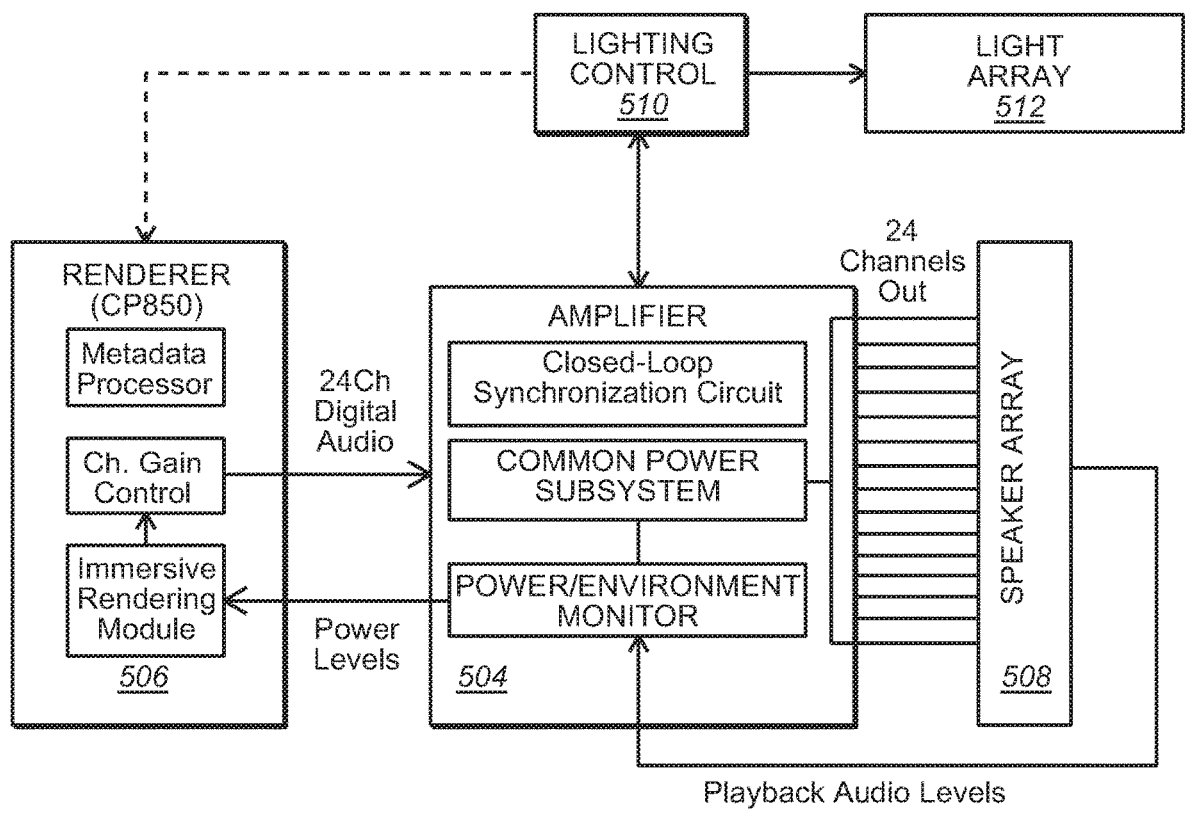
FIG. 5 illustrates a multi-channel amplifier operating in a rendering environment with lighting control, under some embodiments.

FIG. 5 illustrates a multi-channel amplifier operating in a rendering environment with lighting control, under some embodiments. As stated above, in an embodiment, the amplifier 504 is configured to work in conjunction with a compatible renderer 502 that provides the audio signals over the same number of channels (speaker feeds) output by the amplifier.

For the embodiment of FIG. 5, the renderer 502 comprises an immersive audio rendering module and channel gain control to transmit the appropriate digital audio signals to the amplifier 504. A metadata processor processes the corresponding parametric position/location/trajectory data for audio objects to generate the n-channel speaker feeds to the amplifier 504. The amplifier 504 includes a common power subsystem that provides power to all channels of speaker array 508, and sets the per-channel gain values based on the audio content and input from a monitor component that monitors power, environmental and operating conditions. The amplifier 504 may also include a closed-loop synchronization circuit to ensure that channels are clocked and switched at the same time to mitigate noise, beats, and other distortion.

In an embodiment, the amplifier also includes or is coupled to a lighting control unit 510 that uses the amplifiers power subsystem to power the lights 512 of the listening environment (e.g., cinema or theatre). The light array 512 may be any appropriate light or set of lights within the cinema, and may include direct (ceiling/wall) lights, ambient lights, floor path lights, seat lights, and the like. The lights may also be integrated into the speaker. The lights may also be integrated into the speaker. The lights 512 may be coupled to the controller 510 through wired or wireless transmission means.

Metadata from the renderer 502 is received by the amplifier 504 and used to change the lights based on the content generated by the renderer. The metadata may include definitions that dictate light levels (color/intensity), or it may be standard immersive audio metadata that is interpreted by the lighting control unit 510 to generate the appropriate lighting signals to light array 512. The lighting control unit uses the metadata to automate and enhance the ambience of the listening environment. In an embodiment, the light array comprises ambient lights, while the main cinema lights are controlled separately, such as by the cinema operator. The ambient lights may be RGB LEDs that change color based on metadata from the exhibitors to enhance the content marketing, mood of the environment, or augment the audio by providing lighting cues in sync with the audio. The lighting intensity and colors can be changed based on the events of the showing, such as pre-show, intermission, and post-show. For example, the ambient color can be changed to that of the cinema brand or sponsor during these periods when the movie is not playing. The lighting can be synchronized to any music or messages playing in the background, as well. Using the common power subsystem of the amplifier, power is split between the speakers and the lights, so that during a light control period, power to the speakers may be reduced to accommodate powering the lights. Thus, when the ambient or main lights are on, most of the power delivered can be to the lights, and as the lights fade in preparation for pre-show trailers, power is shared and/or switched in the amplifier/speakers from lights to the audio. Light and audio power can be provided using the same two speaker wires, which helps greatly reduce the cost of installation, as separate power lines do not need to be run to the lights. It also greatly enhances automation, as metadata for the audio content can also be used to control the lights, thus ensuring synchronization between lights and sound, and balanced power distribution between the light and speaker feeds.

Besides lights, other actuators can be controlled by the amplifier in sync with the audio content using the metadata that is either generated by the renderer or is transferred in the content. These include steam generators, water sprinklers, fans, smell/aroma generators, prop movements, LCD displays, hologram generators, and so on. Such actuators may be used when the amplifier is deployed in applications such as theme parks, simulators, and industrial/military installations.

Data/Power Distribution System

In an embodiment, the immersive audio renderer and amplifier system includes a distributed system that transmits audio, lighting controls and power to the speaker and lights over a bi-directional bus that utilizes simple two-conductor (e.g., speaker wire) lines. The two-conductor bus transmits audio and lighting control data to provide output and power to the speakers, theatre lights, and mood lights of the theatre. In one or more control units associated with each speaker and light fixture, audio packets received, decoded and speaker feeds generated; likewise light control signals are received and sent to lights, along with the power to the lights. As described with reference to the immersive audio data format, metadata is used to control the lights. In this metadata-driven lighting control system, digital data is superimposed on the power lines sent to lights, and the same power lines provide the speaker feeds carrying the channel-based audio signals. In an embodiment, a multi-channel amplifier (e.g., amp 206) controls and powers the audio, main lights, and mood lights in the cinema 210 using a single two-conductor bus. The amp receives the audio and light control data from a renderer and distributes the power and speaker feed to the speakers and light control data and power to the lights. In an embodiment, the amplifier may be a single unitary amp system, such as shown in FIGS. 3 and 5, or it may be a distributed amplification system.

Figure 6:
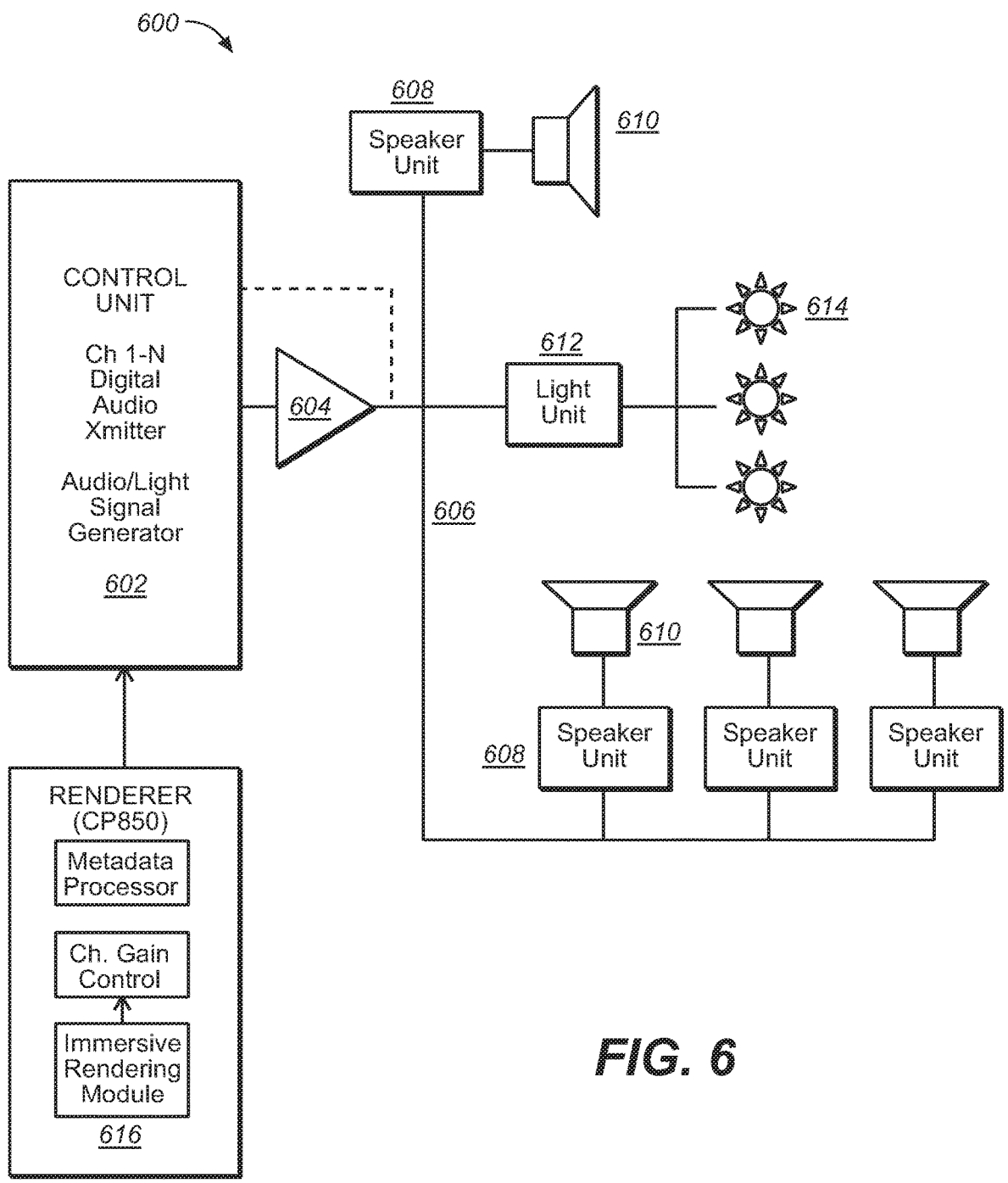
FIG. 6 illustrates a distributed amplification system for controlling mood lighting and data driven lighting under some embodiments.

FIG. 6 illustrates a distributed amplification system under some embodiments. System 600 is a multi-channel speaker system with any number, N, of speakers 208. Instead of having one amplifier and nominally one power supply and separate dedicated cabling per speaker channel, system 600 features one main amplifier and associated control unit 602, one cable run ("bus") 206, and one power supply (or redundant power supply array) 604 for all of the N speaker channels 610. To attain this simplification in the power and signal distribution infrastructure, each speaker channel has associated with it a dedicated speaker unit 608 that receives and recovers the power and audio signal that is generated by the control unit 602. The number N channels can be any practical number of channels dictated by the system requirements. For a standard surround sound setup, N may be 7 or 9, while for a full Atmos type system with height speakers, N can be on the order of 16 or 24 channels or more.

The architecture of system 600 allows for audio power and signal to be distributed to multiple loudspeakers without the use of high channel-count amplifiers and multiple point-to-point cables, thus reducing the number of audio power amplifier channels and the number of independent loudspeaker cables, while still allowing each loudspeaker to have independent drive (i.e., separate audio signals present at each loudspeaker). Amplifier 604 is a power supply that may be implemented as an optimized or standard audio amplifier to transmit a power signal over the bus 606, and control unit 602 comprises an N-channel digital audio transceiver and an audio signal generator that adds a digital audio signal onto the same bus cable. For existing installations, running power and lighting over the existing wiring may be cost effective, using amplified channel outputs to individual speaker wiring connections.

It should be noted that in an embodiment, amp component 604 may represent a general purpose amplifier, or it may represents one or more parts of amplifier 304 of FIG. 3 such that the power sharing functionality 306, power subsystem 308 and detector monitor components 310 and 314 provide an intelligent distribution of power based on the environmental and operational characteristics described above.

A digital audio transceiver of unit 602 transmits multiple digital audio streams in the presence of the power signal generated by the audio amplifier 604. These two signal streams (power and data) are transmitted simultaneously through bus 606, are received by small electronic speaker units 608 built in (or closely coupled) to each loudspeaker 610. The speaker units receive (or recover) the power, receive the digital audio stream, and drive the loudspeakers with the selected signals. In one embodiment, the bus cable 606 is a single standard two-conductor speaker cable of standard gauge (e.g., 10-20 gauge) and can be used to send multiple channels of digital audio and appropriate power to independent loudspeakers connected to the same two-conductor cable. That is, many speakers can be wired in a daisy-chained or parallel fashion while still allowing independent channels of audio to be played at each speaker (i.e., different signals and volumes). The bus cable may be implemented as a simple two-conductor speaker cable or a three-conductor cable, such as an AC power cable where one conductor is an earth ground, or any other similar simple conductor cable. Alternatively to traditional speaker cable (i.e., stranded wire cable), a solid-core Romex (typical AC wiring cable) cable might be used.

In an alternative embodiment, portions of power source 604 may be implemented as a standard power amplifier. Alternatively, it may be implemented as a highly-optimized base-band AC or DC power source, similar to an audio amplifier but with much higher power efficiency and power throughput. For this embodiment, the system would be highly optimized for maximum power transmission, minimized power loss, and lowest cost. In an embodiment, the power supply provides on the order of 5 kW of power to power both the speakers 610 and the lights 614 within the cinema, though other appropriate power levels are also possible.

The loudspeakers 610 may represent a single driver or transducer within a single enclosure (cabinet), or a multi-driver loudspeaker with different transducers handling different audio components (e.g., woofer, midrange, tweeter), or arrays of speakers. In an embodiment, the speaker units 608 can also include additional circuitry to drive each speaker component independently (e.g., woofer, tweeter, etc.) in a bi-amplification system. Both the control unit and each speaker unit includes a transceiver stage allowing for bidirectional data flow between the digital audio transceiver of the control unit and the multiple speakers residing on the bus. Thus, other pieces of information can be propagated to-and-from the loudspeaker. For example, a loudspeaker could report telemetry (e.g., down-angle, temperature, etc.), and/or setup information could be sent to individual speakers (e.g., volume control, LED lighting effect controls, angle adjustment for motorized pan-tilt, and so on). In systems utilizing bi-amplification within the speaker, derivation of two (or more) audio signals can be done by sending the speaker unit 608 a single audio stream, wherein the speaker unit employs signal processing to derive two (or more) audio signals from a single input stream. Alternatively, the control unit 602 may send the multiple streams directly to the individual amplification stages within the speaker unit 608.

For the embodiment of FIG. 6, the amplifier 602 and power supply 604 also provide control signals and power over the single bus 606 to power lights 614 within the theatre. The lights may comprise main overhead and wall lights for lighting the cinema as well as mood or ambient lights placed in specified locations if the cinema. The lights 614 comprise single or multi-colored LEDs in appropriate fixtures distributed around the cinema. The number and power rating of the lights depends on the size and requirements of the venue, and in a typical installation, up to 3 kW of power from the power supply 604 may be provided to power the lights, out of an example total power supply of 5 kW, though embodiments are not so limited.

The balance of total available power between the lights 614 and the speakers 610 takes into account that full audio power and full lighting power are usually not required at the same time. That, is full lights are typically used when a movie is not being used, and conversely the main lights are off while the movie is playing. Certain ambient or mood lighting, which is typically not high intensity lighting may be required during high speaker output, and the control unit is configured to provide an optimum balance of sound/light power during periods when power for both sound and light output is required.

Figure 7:
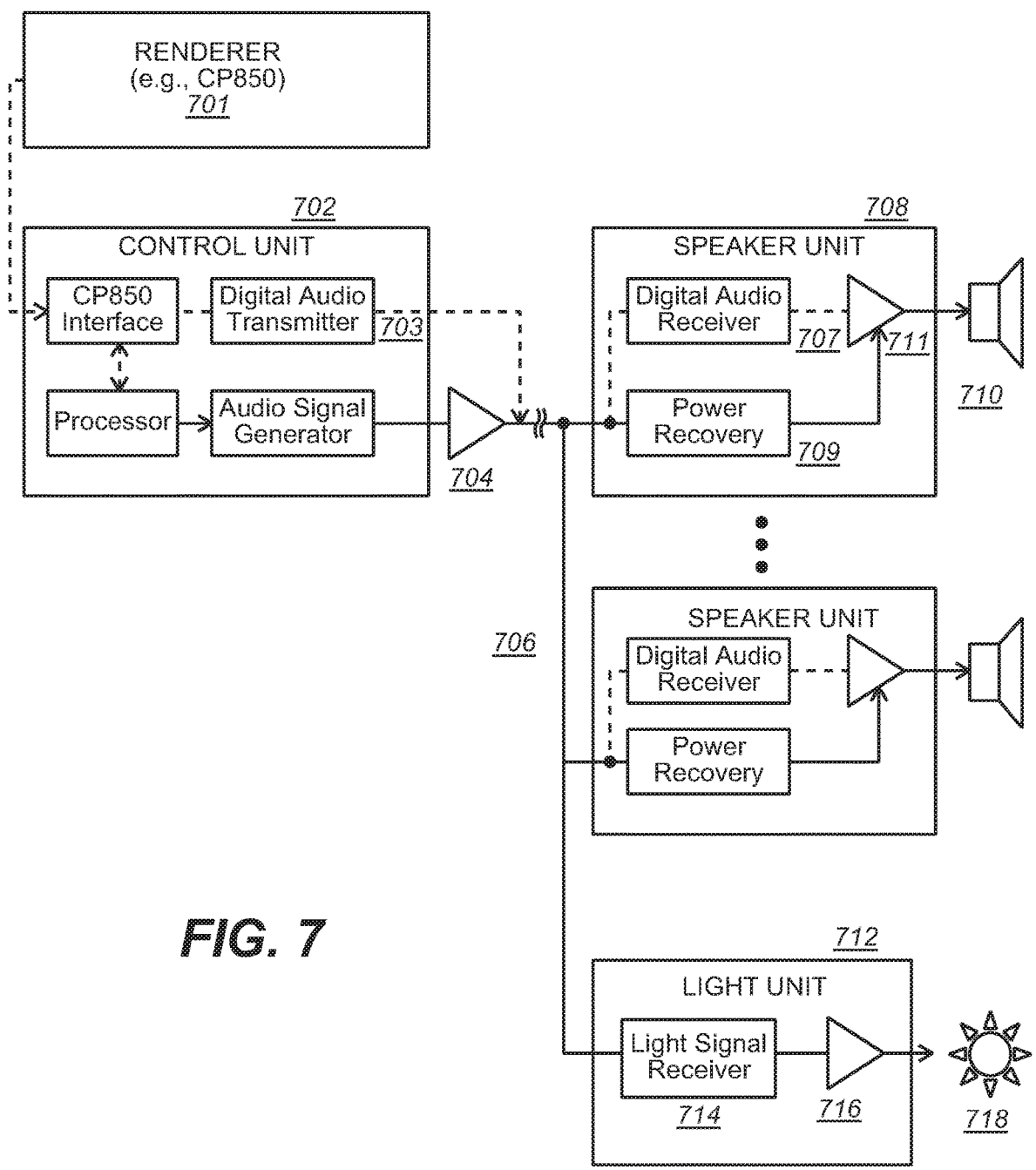
FIG. 7 illustrates components of control and speaker units for the distributed amplification system of FIG. 6 under some embodiments.

FIG. 7 illustrates components of control and speaker units for the distributed amplification system of FIG. 6 under some embodiments. In an embodiment, power source 704 comprises a standard audio amplifier to provide power for other distributed audio output stages. This helps achieve an efficiency goal of component reuse by eliminating one of the largest cost drivers in any audio amplifier design, i.e., the power supply. An audio power amplifier is typically designed as an AC-DC power supply, feeding into one or more low-impedance, transistorized, output stages. Most audio amplifiers are designed as two- to four-channel devices, wherein there is a singular power supply (AC/DC offline supply) fanning out to power the output stages. The architecture of the system 700 subdivides the audio amplification process such that the power supply is physically separated from the individual output stages and is chosen such that it effectively supplies an AC stimulus to power multiple output stages. The power supply can thus be implemented as a standard audio amplifier that develops a controlled, audio-band, AC waveform, and provide regulatory compliance (e.g., NRTL, CE, FCC, safety isolation, etc.).

For the embodiment of FIG. 7, the modulating input waveform applied to the power source audio amplifier is generated by an audio signal generator in control unit 702. Because the output of the power source amplifier is used only for distributing power to the various output stages, no significant fidelity or spectral-purity requirement is imposed upon this power amplifier. Similar to the signals present on typical AC mains (120 Vrms, 60 Hz); the power source audio amplifiers would generate an AC waveform optimized for powering downstream distributed audio output stages. This allows an existing audio amplifier to serve as the power source for a distributed array of output stages, and a single cable 706 can power multiple output stages 710. As with any paralleled power distribution system, the overall power consumption would have to be adequately determined and managed, such that the power source amplifier and cabling could adequately deliver the power as needed by the sum total of all distributed output stages connected to the line. In cases where more power is needed, or a greater number of paralleled output stages are attached to the line, the power source amp could be bridged or paralleled with a like amplifier. An example power supply may be a cinema-grade amplifier (e.g., Crown DSi2000) that delivers 800 W per channel into 4 ohms or 1000 W per channel into 2 ohms, or any similarly rated amplifier.

For the embodiment of FIG. 7, the control unit 702 generates digital audio signals and light control signals that comprises immersive audio having both channel-based and object-based audio components. For the example of FIG. 7, a CP850 interface couples the control unit 702 to a CP850 renderer, for example. This interface and processor provide the signal to an audio signal generator that stimulates the power source 704. A digital audio transmitter 703 of the control unit 702 outputs the digital audio signal directly to the output of the power source so that both power and the digital audio signal are carried on the bus cable 706. The control unit also includes appropriate circuitry that conditions the power and data to endure that they are properly transmitted over the bus in terms of timing, amplitude, and phase. Although embodiments are illustrated with respect to adaptive audio applications, it should be noted that any appropriate audio format may be used, and that, depending on the type of interface provided in control unit 702, the input audio may be straight digital audio, hybrid audio, pure channel-based audio, pure object-based audio, and so on. In the case where analog audio is provided, the system may include an integrated or separate analog-digital converter to provide the required digital audio signal to stimulate the power supply 704 and provide digital audio input to the bus cable 706. In an embodiment, the control unit 702 outputs digital data primarily to be coupled into the output of the power source, and input to the power source is stimulated with an analog audio-band modulation signal (i.e., sine wave, pink-noise, summed audio signal, etc.). Thus, digital data is primarily routed/coupled to the output of the power source, whereas the input to the power source can be controlled via digital or analog techniques.

In an embodiment in which the power source 704 comprises a standard or other type of amplifier, the system 700 can be configured to create power stimulus signals into the amplifier as well as having a line connected to the output of the amplifier to inject the digital data stream onto the speaker wire or bus cable 706. The digital data stream wire can also be used as a sense line for the controller through an A/D (analog/digital) circuit. The controller 702 can then compare the input and output signals coming from the respective amplifier channel. This allows additional features to be implemented in the software (or equivalent circuitry) such as gain modification adjustment (e.g., if the user changes the amplifier gain, the system can adjust the input signal to compensate), fault monitoring for distortion, fault monitoring for signal present, automated system configuration to optimize gain structure, and other similar functions. For the fault monitoring applications, if a fault is found, the system can be configured to log the fault, send a fault notification over a connected network (e.g., Internet), and/or send an audible or visual alert, such as by sounding an alarm tone or flashing the amplifier signal light on the faulty amplifier channel(s) by sending pulses of the power signal to the corresponding channel.

In an embodiment, the bus cable 706 that links the control unit 702 to each of the speaker units 708 is a single two-conductor speaker cable (or three-conductor power cable or similar). Data is transmitted over the bus using Internet Protocol (IP) conventions, though other protocols are also possible. A standard power-line communication format is utilized to provide sufficient bandwidth and channel separation to allow the channelized audio information produced by the control unit to be delivered to the output stages. Examples of standard power-line communication protocol include IEEE 1901 (HomePlug AV 1.1) and the G.hn protocol. It should be noted that embodiments are not so limited, and other standardized protocols, or proprietary techniques for transmitting digital audio information over power source cabling to deliver independent audio streams to distributed output stages are also possible.

The power signal, digital audio signal and metadata for audio object control and lighting control are transmitted over the same conductors and are encoded in different bands of the frequency spectrum. The power and audio signals may be separated by frequency band. For example, the power component may be relegated to a relatively low frequency band of between 0 (DC) and 20 kHz, while the digital data component for the audio and lighting control may be carried in a band stretching between 1 MHz to 100 MHz, as an example, though embodiments are not so limited.

As shown in FIG. 7, the power and audio/lighting signals transmitted by bus 706 are received by the number N speaker units 710. Each speaker unit 708 includes a digital audio transceiver (usually set to receive mode) 707, a power receiving circuit 709 and an output stage 711 to drive the associated speaker. The digital audio receiver decodes the audio signal and transmits the appropriate channel (or object) audio to the output stage for driving the connected speaker 710. The digital audio receiver, may be referred to more generally as a digital audio transceiver in that it may be configured to transmit information back to the control unit 702. In an embodiment, the digital audio transceiver 707 may be configured to transmit status information (e.g., thermals, voltages, currents, impedances, down-angles, etc.) back to the control unit. The transmission protocols (e.g., 1901 and G.hn) and PLC components typically support bi-directional communication in the data-link between the speaker units 708 and the control unit 702. For the bi-directional data-link case, the data transmitter 703 in the control unit 702 is also more generally represented as a transceiver rather than just a transmitter. The components 703 and 707 may each be configured to operate in both or either of transmit/receive modes depending on the data-link configuration and communication direction. Thus, the system may be configured for full-duplex mode (bi-directional communication) or it may be set up for half-duplex operation (uni-directional communication), therefore a switching operation for the transceivers may be a discrete operation (half-duplex case) or it may be an automatic operation (full-duplex case).

One or more sensors may also be provided and associated with the speaker unit to gather status information, such as the operating conditions and characteristics listed above (thermals, voltages, currents, impedances, down-angles, etc.), as well as other relevant characteristics. The digital audio transceiver includes a decode circuit that decodes the channel assignment provided in the multi-channel digital data and modulates the digital data to the associated speaker based on the decoded channel assignment, such that different source content can be played back through each speaker of the N speakers.

Each speaker unit constitutes an "intelligent" piece of electronics at each loudspeaker and the transceiver interface between the control unit and each speaker unit establishes a bi-directional digital communication channel such that each cabinet can digitally report various pieces of telemetry useful for system commissioning, maintenance, and monitoring. Operational parameters include aspects such as down-angle, localization, excursion, etc. Also, as a result of having an on-board power supply and stable power-source to all speakers, loudspeakers can employ I/O devices as needed, such as LEDs, effect lighting, and servo motor control for pan-tilt automation. Loudspeaker telemetry awareness (e.g., down angle, localization, etc.), and performance/fault monitoring per speaker also are possible features. Because the output stages feature local capacitive bulk storage, each channel has an added level of isolation from adjacent channels. This is beneficial in reducing amplifier cross-talk and inter-dynamic interference, and supplements the advantage of having the capacitive bulk storage provide an energy harvesting feature by allowing short-duration moments of higher voltage swings greater than the voltage present within the power source signal.

For the embodiment of FIG. 7, in addition to the audio signals, bus 706 carries light control signals and power to power the theatre and mood lights. A light unit 712 coupled to one or more main and/or ambient lights 718 of the theatre receives the lighting control data transmitted from control unit 702. An output stage 716 may be used to drive light 718. The light unit 712 may unpack the metadata superimposed on the digital audio/power signal to turn on each active light to the appropriate color and brightness. Light cues directing the theatre lights can be programmed by the content creator as part of the show and encoded in the film or soundtrack to provide pre-show, post-show or even in-show light effects. This eliminates the need for separate light controls, as is typically provided by a theatre operator at present.

The speaker and light functions can be provided in unitary or separate fixtures. In a traditional installation, speakers are provided in their own cabinets and enclosures and mounted in appropriate locations of the theatre, while lights are provided in their own fixtures along the ceiling, walls and floors of the theatre. In this embodiment, each speaker or speaker array and light or light array may have its own unit 708 or 712, and control unit 702 transmits the data/power signals over bus 706 to each unit. In an alternative embodiment, the speakers and lights (mood and/or main) may be provided as part of the same fixture.

Figure 8:
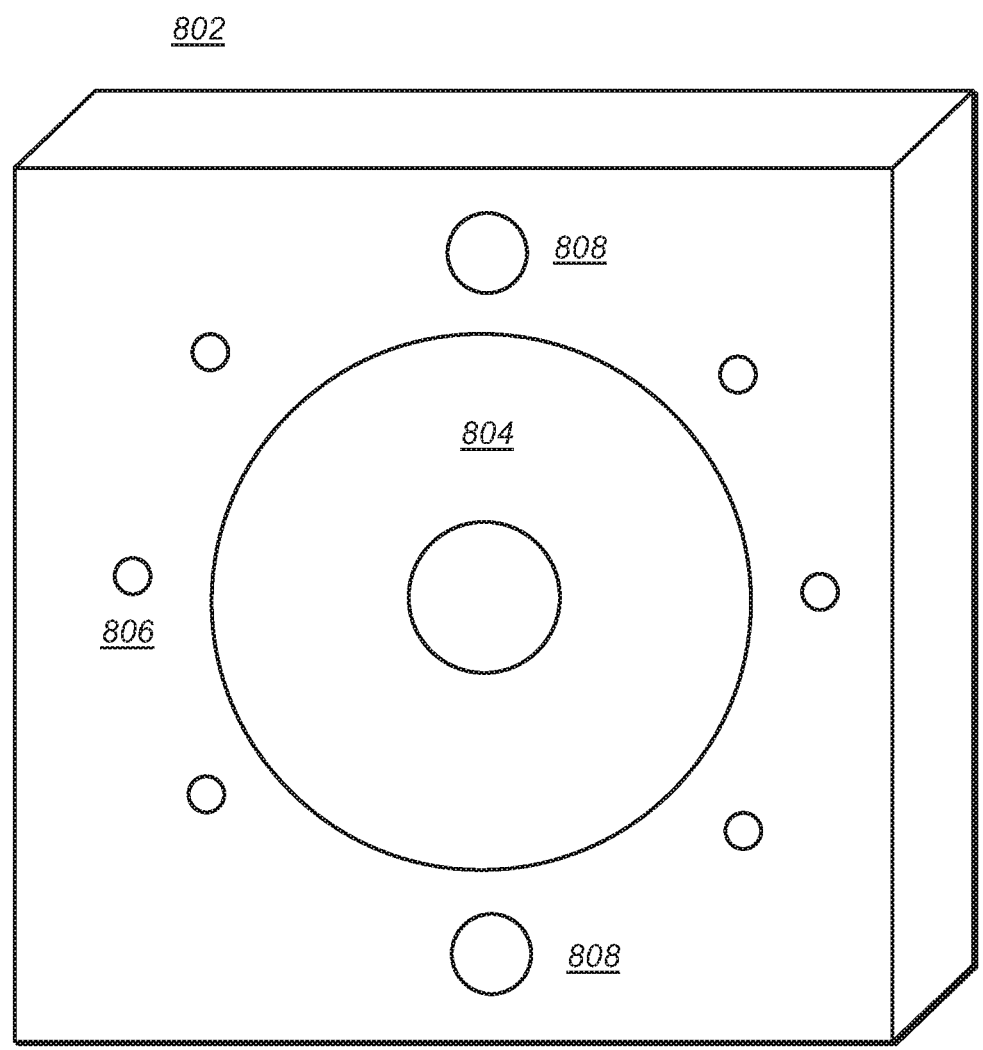
FIG. 8 illustrates a combination speaker/light fixture under some embodiments.

FIG. 8 illustrates a combination speaker/light fixture under some embodiments. As shown in FIG. 8, a cabinet 802 includes a driver or drivers 804 and one or more LED lights 806. Each of the lights may be a single or multi-colored LED and they may be of different configurations (size/color) to provide different functions. For example, LEDs 806 may be smaller multi-colored units for mood or indicator functions, while LEDs 808 may be larger while LEDs for main lights.

Figure 9:
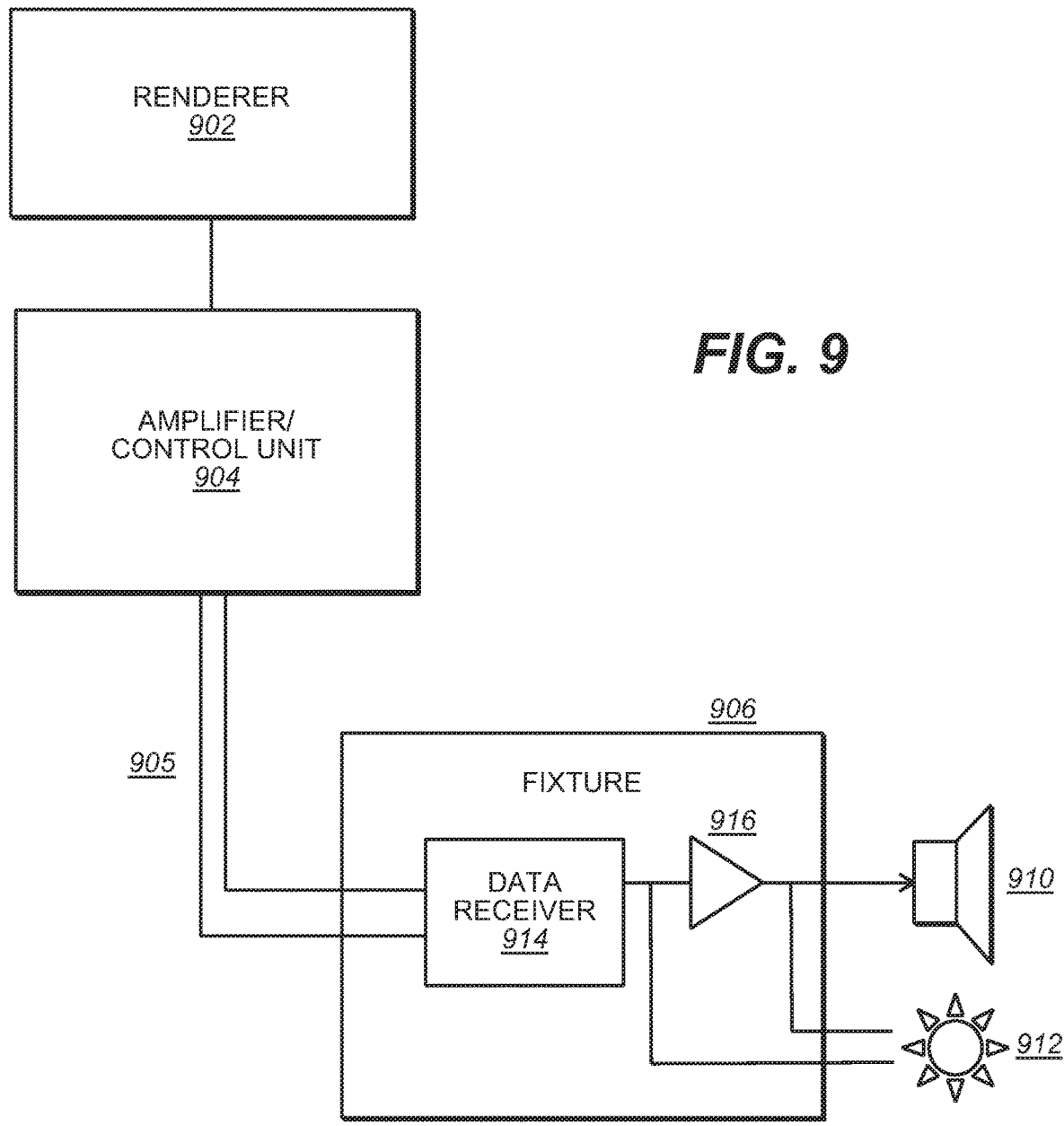
FIG. 9 illustrates distribution of audio/light control and power to a speaker/light fixture under some embodiments.

FIG. 9 illustrates distribution of audio/light control and power to a speaker/light fixture under some embodiments. Audio and light signals are provided by renderer 902 to amplifier/controller 904. The immersive audio objects and light control data is provided as metadata that is transmitted along with the audio data to the amplifier 904. Amplifier 904 provides the necessary per-channel gains as described above and the power, speaker feeds and lighting control (main/mood) data to the fixture 906. Fixture 906 can include one or more speakers (drivers) 910 and lights 912, or it can be closely coupled to the speakers and lights. The lighting control data is provided as metadata that is superimposed onto the audio and power signals sent by amplifier 904 to the fixture 906 over two-conductor bus 905. The signals are received in a data receiver 904 which sends the speaker feed to speaker 910 and the lighting control data and power to the light 912, which may also be driven by output stage 916.

Although example implementations are described with respect to certain specified components, such as the Dolby CP850, it should be noted that embodiments are not so limited and any similar or other appropriate component may be used.

Embodiments of the audio amplifier described herein may be used in any appropriate venue or application, such as cinema, home cinema, live venue, auditorium, industrial facility, military facility, theme park, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," and "hereunder" and words of similar import refer to this application as a whole and not to any particular portions of this application. When the word "or" is used in reference to a list of two or more items, that word covers all of the following interpretations of the word: any of the items in the list, all of the items in the list and any combination of the items in the list. While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

Various aspects of the present invention may be appreciated from the following enumerated example embodiments (EEEs):

EEE 1. A system comprising:
- a power source outputting power to drive speakers and lights in a venue;
- a control unit coupled to the power source and outputting multi-channel digital audio data to the speakers and light control data to the lights; and
- a unitary transmission bus coupling the output of the power source to the speakers and the lights and transmitting the power, the digital audio data, and the light control data over a common conductor of the bus to the speakers and the lights.

EEE 2. The system of EEE 1 further comprising a speaker unit associated with each speaker configured to recover the power to drive the associated speaker and transmit an appropriate channel of the multi-channel digital data to the associated speaker.

EEE 3. The system of EEE 2 further comprising a light unit associated with each light and configured to decode the light control data to light the associated light.

EEE 4. The system of any of EEEs 1 to 3 further comprising an interface to a renderer including an immersive audio sound processor associating metadata encoding the light control data and parametric trajectory information for the digital audio with speaker feeds for multi-channel digital audio.

EEE 5. The system of any of EEEs 1 to 4 wherein the speaker unit comprises:
- a power recovery circuit comprising a low impedance speaker driver coupled to a capacitive storage element; and
- a dedicated digital data transceiver configured to operate in transmit or receive mode and configured to decode a channel assignment provided in the multi-channel digital data and modulate the appropriate multi-channel digital data to the associated speaker based on the decoded channel assignment, such that different source content can be played back through the corresponding speaker.

EEE 6. The system of any of EEEs 1 to 5 wherein the light comprises one of a main venue light and a mood light, and wherein the light comprises a multi-colored light emitting diode.

EEE 7. The system of any of EEEs 1 to 6 further comprising one or more additional actuators controlled by the amplifier in sync with the audio content using the metadata transferred in the audio content, the actuators selected from the group consisting of: steam generators, water sprinklers, fans, smell/aroma generators, prop movements, LCD displays, and hologram generators.

EEE 8. The system of any of EEEs 1 to 7 wherein the digital audio data and light control data is transmitted using an Internet Protocol (IP) transmission or other communication method, and wherein audio data comprises at least in part immersive audio content having channel-based audio and object-based audio.

EEE 9. The system of EEE 8 further comprising an interface to a renderer including an immersive audio sound processor associating metadata encoding the light control data and parametric trajectory information for the object-based audio with speaker feeds for the multi-channel digital audio data.

EEE 10. The system of EEE 9 wherein the light control data is synchronized with the multi-channel digital audio data so that illumination of the venue and mood lights is controlled directly in relation to the audio data.

EEE 11. The system of any of EEEs 1 to 10 wherein the lights and speakers are packaged in fixtures containing at least one speaker and one light within a single cabinet.

EEE 12. The system of any of EEEs 1 to 11 wherein the control unit comprises part of an audio amplifier having:
a power supply stage coupled to a mains power supply and providing power to drive channels corresponding to speaker feeds to the speakers;
a monitor component coupled to the power supply stage and monitoring environmental and operating characteristics of the amplifier; and
a power controller coupled to the monitor component and adjusting per-channel gain values based on per-channel characteristics, power distribution characteristics, speaker health characteristics, and mains power supply characteristics.

EEE 13. The system of EEE 12 wherein the per-channel and power distribution characteristics comprise at least one of: voltage and current of the mains power supply, circuit breaker rating, thermal measurements, and speaker loads, and further wherein the thermal measurements comprise at least one of: per-channel temperature, power supply temperature, ambient temperature, overall internal amplifier temperature, the system further comprising a thermal controller adjusting a speed of one or more fans to reduce a temperature profile of the amplifier if it is detected or predicted to exceed a defined temperature limit.

EEE 14. A method comprising:
encoding multi-channel digital audio data to be transmitted within a first transmission band and power to be transmitted within a second transmission band to drive speakers for playback of the audio data in a venue;
encoding lighting control data to be transmitted within a third transmission band to power lights in the venue;
transmitting the digital audio data, power, and lighting control data over a single transmission bus to the speakers and lights;
at each speaker, recovering the power to drive the speaker and decode the data to playback a specific channel of the multi-channel digital data through the speaker so that different source content is played back through each speaker of the plurality of speakers; and
at each light, decoding the lighting control data to illuminate the light to an appropriate intensity and color.

EEE 15. The method of EEE 14 wherein the light comprises one of a main venue light and a mood light.

EEE 16. The method of EEE 15 wherein the light comprises a multi-colored light emitting diode, or similar energy efficient, electronically controlled, multi-colored lighting device.

EEE 17. The method of any of EEEs 14 to 16 wherein the digital audio data and light control data is transmitted using an Internet Protocol (IP) transmission, or other communication method, and wherein audio data comprises at least in part immersive audio content having channel-based audio and object-based audio.

EEE 18. The method of EEE 17 further comprising providing an interface to a renderer including an immersive audio sound processor associating metadata encoding the light control data and parametric trajectory information for the object-based audio with speaker feeds for the multi-channel digital audio data.

EEE 19. The method of EEE 18 wherein the light control data is synchronized with the multi-channel digital audio data so that illumination of the venue and mood lights is controlled directly in relation to the audio data.

EEE 20. The method of any of EEEs 14 to 19 further comprising:
generating speaker feeds from a power supply stage coupled to a mains power supply and providing power to drive channels corresponding to the speaker feeds to the speakers;
monitoring environmental and operating characteristics of the power supply stage; and
adjusting per-channel gain values based on the mains power supply and the environmental and operating characteristics of the amplifier.

EEE 21. The method of EEE 20 further comprising:
monitoring operating conditions of the speakers; and
adjusting the per-channel gains to compensate for any fault in any of the speakers.

EEE 22. The method of any of EEEs 20 or 21 wherein the environmental and operating characteristics comprise at least one of: voltage of the mains power supply, circuit breaker rating, per-channel temperatures, ambient temperature, temperature of the power supply stage, and load of the speaker feeds.

EEE 23. The method of EEE 22 wherein the power supply stage provides maximum voltage and current on each channel of the speaker feeds under normal operating conditions and according to current and voltage availability of the mains power.

EEE 24. The method of EEE 23 further comprising reducing the gain to at least one of the channels in the event of a negative environmental or operating condition.

EEE 25. The method of EEE 14 wherein the lighting control data comprises metadata superimposed over the digital audio data and power.

EEE 26. The method of EEE 14 further comprising controlling a plurality of amplifiers configured in a master/slave arrangement for gain control, automation, environmental awareness, and speaker/lighting compensation.

The invention claimed is:

1. A system comprising:
an audio signal generator for generating an analog audio-band modulation signal;
a power source audio amplifier stimulated by the modulation signal generated by the audio signal generator and configured to output a controlled, audio-band, AC waveform for driving speakers and lights in a venue;
a control unit comprising the audio signal generator, the control unit being coupled to the power source audio amplifier and configured to output multi-channel digital audio data and light control data to the output of the power source audio amplifier;
a gain control component of the amplifier for controlling each channel of the multi-channel digital audio data in response to one or more operating or environmental conditions, and configured to determine a respective per-channel gain value and a global gain value to be applied to each channel of the digital audio data, the global gain comprising a power distribution for the system considering ambient and amplifier temperatures, and speaker feed total voltage and current values, and further wherein each per-channel gain value comprises individual channel voltages, currents, operating temperatures, and pulse width modulated (PWM) duty cycle; and
a unitary transmission bus for coupling the output of the power source audio amplifier and the output of the control unit to the speakers and the lights and for transmitting the power, the digital audio data, and the light control data over the bus to the speakers and the lights.

2. The system of claim 1 further comprising a speaker unit associated with each speaker configured to provide the power to drive the associated speaker and transmit an appropriate channel of the multi-channel digital audio data to the associated speaker.

3. The system of claim 2 further comprising a light unit associated with each light and configured to decode the light control data to light the associated light.

4. The system of claim 1, further comprising a renderer including an immersive audio sound processor associating metadata encoding the light control data and parametric trajectory information for the digital audio with speaker feeds for multi-channel digital audio.

5. The system of claim 2 wherein the speaker unit comprises:
a power recovery circuit for providing the power to drive the associated speaker; and
a dedicated digital data transceiver configured to operate in transmit or receive mode and configured to decode a channel assignment provided in the multi-channel digital audio data and modulate the appropriate multi-channel digital audio data to the associated speaker based on the decoded channel assignment, such that different source content can be played back through the corresponding speaker.

6. The system of claim 1, wherein at least one of the lights comprises one of a main venue light and a mood light, and wherein the light comprises a multi-colored light emitting diode.

7. The system of claim 1, further comprising one or more additional actuators controlled by the amplifier in sync with audio content using metadata transferred in the audio content, the actuators selected from the group consisting of: steam generators, water sprinklers, fans, smell/aroma generators, prop movements, LCD displays, and hologram generators.

8. The system of claim 1, wherein the digital audio data and light control data is transmitted using an Internet Protocol (IP) transmission or other communication method.

9. The system of claim 8 further comprising a renderer including an immersive audio sound processor associating metadata encoding the light control data and parametric trajectory information for object-based audio with speaker feeds for the multi-channel digital audio data.

10. The system of claim 9 wherein the control unit is configured to output the multi-channel digital audio data and the light control data such that the light control data is synchronized with the multi-channel digital audio data so that illumination of the venue and mood lights is controlled directly in relation to the audio data.

11. The system of claim 1, wherein the lights and speakers are packaged in fixtures containing at least one speaker and one light within a single cabinet.

12. The system of claim 4 wherein the renderer is configured to send the digital audio data to the amplifier a certain number of milliseconds ahead of playback of the digital audio data to provide time for the amplifier to set respective gain levels for each channel by the gain control component.

13. The system of claim 1 wherein the one or more operating or environmental conditions comprise: speaker faults, audio equipment faults, venue acoustic performance, and power supply health.

14. The system of claim 1 wherein the control unit is configured to balance power required for audio playback versus power required for the lights by reducing lighting power when playback content requires full audio power, and increasing lighting power when playback content does not require full audio power.

15. A system comprising:
an audio signal generator for generating an analog audio-band modulation signal;
a power source audio amplifier stimulated by the modulation signal generated by the audio signal generator and configured to output a controlled, audio-band, AC waveform for driving speakers and lights in a venue;
a control unit comprising the audio signal generator, the control unit being coupled to the power source audio amplifier and configured to output multi-channel digital audio data and light control data to the output of the power source audio amplifier, and to synchronize the light control data with the multi-channel digital audio data so that illumination of the venue and mood lights is controlled directly in relation to the audio data, and further configured to balance power required for audio playback versus power required for the lights by reducing lighting power when playback content requires full audio power, and increasing lighting power when playback content does not require full audio power; and
a unitary transmission bus for coupling the output of the power source audio amplifier and the output of the control unit to the speakers and the lights and for transmitting the power, the digital audio data, and the light control data over the bus to the speakers and the lights.

16. The system of claim 15 further comprising a gain control component of the amplifier for controlling each channel of the multi-channel digital audio data in response to one or more operating or environmental conditions.

17. The system of claim 16 wherein the gain control component is configured to determine a respective per-channel gain value and a global gain value to be applied to each channel of the digital audio data.

18. The system of claim 17 wherein the global gain comprises a power distribution for the system considering ambient and amplifier temperatures, and speaker feed total voltage and current values, and further wherein each per-channel gain value comprises individual channel voltages, currents, operating temperatures, and pulse width modulated (PWM) duty cycles.

* * * * *